US011302365B2

(12) United States Patent
Kumar et al.

(10) Patent No.: US 11,302,365 B2
(45) Date of Patent: Apr. 12, 2022

(54) AREA EFFICIENT AND HIGH-PERFORMANCE WORDLINE SEGMENTED ARCHITECTURE

(71) Applicant: Synopsys, Inc., Mountain View, CA (US)

(72) Inventors: Vinay Kumar, Bengaluru (IN); Neeraj Kapoor, Bengaluru (IN); Sudhir Kumar, Bengaluru (IN); Amit Khanuja, Bengaluru (IN)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 16/583,657

(22) Filed: Sep. 26, 2019

(65) Prior Publication Data

US 2020/0105309 A1 Apr. 2, 2020

(30) Foreign Application Priority Data

Sep. 27, 2018 (IN) .............................. 201811036397

(51) Int. Cl.
*G11C 11/418* (2006.01)
*G11C 5/06* (2006.01)
*G11C 11/412* (2006.01)

(52) U.S. Cl.
CPC ............ *G11C 5/063* (2013.01); *G11C 11/412* (2013.01); *G11C 11/418* (2013.01)

(58) Field of Classification Search
CPC ..... G11C 5/063; G11C 11/418; G11C 11/412; G11C 7/227; G11C 8/14; G11C 8/08
See application file for complete search history.

(56) References Cited

U.S. PATENT DOCUMENTS

| 4,958,326 | A | * | 9/1990 | Sakurai | G11C 7/20 365/185.06 |
| 5,708,621 | A | * | 1/1998 | Tanoi | G11C 8/14 365/230.06 |
| 5,812,483 | A | * | 9/1998 | Jeon | G11C 8/14 365/230.06 |
| 2003/0086286 | A1 | * | 5/2003 | Kang | G11C 11/22 365/145 |
| 2007/0201262 | A1 | * | 8/2007 | Joshi | G11C 11/4125 365/154 |

(Continued)

*Primary Examiner* — Khamdan N. Alrobaie
(74) *Attorney, Agent, or Firm* — Sterne, Kessler, Goldstein & Fox P.L.L.C.

(57) ABSTRACT

A memory array including a plurality of memory cells and a plurality of drivers is disclosed. The plurality of memory cells may be arranged in a plurality of rows and a plurality of columns. Memory cells corresponding to a row of the plurality of rows may be logically grouped into a plurality of memory array segments. The plurality of drivers may be coupled to corresponding first ends of corresponding memory array segments of the plurality of memory array segments. Second ends of the corresponding memory array segments may be coupled to second ends of corresponding adjacent memory array segments of the plurality of memory array segments. The second ends of the corresponding memory array segments and the second ends of corresponding adjacent memory array segments may be coupled to corresponding wordlines of a plurality of wordlines.

20 Claims, 26 Drawing Sheets

(56) References Cited

U.S. PATENT DOCUMENTS

2013/0051128 A1\* 2/2013 Lu .................... G11C 5/063
365/154
2015/0213881 A1\* 7/2015 Rai .................... G11C 11/419
365/154

\* cited by examiner

Access Time Comparison

AREA EFFICIENT AND HIGH-PERFORMANCE WORDLINE SEGMENTED ARCHITECTURE

CROSS-REFERENCE TO RELATED APPLICATIONS

The present application claims the benefit of Indian Patent Appl. No. 201811036397, filed on Sep. 27, 2018, which is incorporated herein by reference in its entirety.

COPYRIGHT NOTICE

The assignee of this patent document has no objection to the facsimile reproduction by anyone of the patent document itself, or of the patent application, as it appears in the files of the United States Patent and Trademark Office, but otherwise reserves all rights whatsoever in any included works of authorship protected by copyright.

SPECIFICATION—DISCLAIMERS

In the following Background, Summary, and Detailed Description, paragraph headings do not signify limitations. In these writings, the citation or identification of any publication signifies neither relevance nor status as prior art. Many paragraphs in this disclosure are common to multiple Synopsys patent specifications.

FIELD(S) OF TECHNOLOGY

The following information is solely for use in searching the prior art. This disclosure has significance in the field of SRAM memory, particularly high-performance and area efficient SRAM design.

BACKGROUND

The growth of battery-powered mobile and wearable devices has increased the importance of low power operation and cost in system-on-a-chip (SoC) design. The continual scaling of CMOS technology has taken embedded static random access memory (SRAM) into the nanoscale regime where performance for Memory IP is not limited by gate delay but limited by interconnect wire delay. In advanced nodes, there is constant stress on Memory IP to follow similar area and performance scaling comparable to standard cell library to allow SoC designers to achieve best possible performance and area metrics. In memory complier design, the array size can be up to 256×640 configuration, i.e., 256 memory cells in bitline direction as row per bitline (RPB), and 640 bitcells in wordline direction as column per side (CPS). In SRAM, a wordline (WL) is connected to pass gate of a bitcell and is routed over a wide bitcell array and faces the issue of high wire RC delay for wider memories. The SRAM in FinNET may have many layers depending on the technology node. And, the resistance of lower metal layer severely impacts the RC delay.

To address the high RC delay of the WL in SRAM, the WL is routed in higher metal track in addition to the routing in lower metal track, which is knowns as wordline-strapping (WL-strapping) technique. Effective wordline wire RC delay across different FinFET nodes, such as 16 nm and 7 nm, indicates that wordline RC delay for 16 nm FinFET node is about 0.8 times the wordline RC delay for 7 nm FinFET node. Thus, effective RC delay increase in 7 nm FinFET node is about 20%. With each generation of FinFET process technology, increase in resistance creates its own challenges such that even WL-strapping in higher metal layers also becomes ineffective beyond some CPS range, i.e., for a wider memory.

SUMMARY

This Summary is a prelude to the Detailed Description. This Summary, together with the independent Claims, signifies a brief writing about at least one claimed invention (which can be a discovery, see 35 USC 100(a); and see 35 USC 100(j)), for use in commerce that is enabled by the Specification and Drawings.

The claims signify a brief description of one or more of the innovations, embodiments, and/or examples found within this disclosure.

This disclosure describes a memory. The memory may include a plurality of memory cells arranged in a plurality of rows and a plurality of columns. Memory cells corresponding to a row of the plurality of rows may be logically grouped into a plurality of memory array segments. The memory may further include a plurality of drivers coupled to corresponding first ends of corresponding memory array segments of the plurality of memory array segments. Second ends of the corresponding memory array segments may be coupled to second ends of corresponding adjacent memory array segments of the plurality of memory array segments. The second ends of the corresponding memory array segments and the second ends of corresponding adjacent memory array segments may be coupled to corresponding wordlines (WLs) of a plurality of WLs.

This disclosure also describes a method for a memory array production. The method may include determining a count of memory array segments of a row of a plurality of rows. The row of the plurality of rows may include a plurality of memory cells arranged in a plurality of columns. The method may also include grouping the plurality of memory cells corresponding to the row of the plurality of rows into a plurality of memory segments according to the count of the memory array segments. The method may further include coupling a plurality of drivers to corresponding first ends of corresponding memory array segments of the plurality of memory array segments. The method may also include coupling second ends of the corresponding memory array segments to second ends corresponding adjacent memory array segments of the plurality of memory array segments. The method may further include coupling the second ends of the corresponding memory array segments and the second ends of corresponding adjacent memory array segments to corresponding wordlines (WLs) of a plurality of WLs.

This disclosure also describes a non-transitory computer-readable device having instructions stored thereon that, when executed by at least one computing device, causes the at least one computing device to perform operations including determining a count of memory array segments of a row of a plurality of rows. The row of the plurality of rows may include a plurality of memory cells arranged in a plurality of columns. The operations may further include grouping the plurality of memory cells corresponding to the row of the plurality of rows into a plurality of memory segments according to the count of the memory array segments, and coupling a plurality of drivers to corresponding first ends of corresponding memory array segments of the plurality of memory array segments. Operations may further include coupling second ends of the corresponding memory array segments to second ends corresponding adjacent memory array segments of the plurality of memory array segments. The operations may also include coupling the second ends of the corresponding memory array segments and the second ends of corresponding adjacent memory array segments to corresponding wordlines (WLs) of a plurality of WLs.

This Summary does not completely signify the claimed inventions. This Summary (as well as the Abstract) neither signifies essential elements of, nor limits the scope of, the claimed inventions enabled by the Specification and Figures.

DRAWINGS

The following Detailed Description, Figures, and Claims signify the uses and advantages of the claimed inventions, and their embodiments. All of the Figures are used only to provide knowledge and understanding and do not limit the scope of the claimed inventions and their embodiments. Such Figures are not necessarily drawn to scale.

Similar components or features used in the Figures can have the same, or similar, reference signs in the form of labels (such as alphanumeric symbols, e.g., reference numerals), and can signify a similar or equivalent use. Further, various components of the same type can be distinguished by following the reference label by a dash and a second label that distinguishes among the similar components. If only the first reference label is used in the Specification, its use applies to any similar component having the same first reference label irrespective of the second reference label. A brief description of the Figures is below.

In the Figures, reference signs can be omitted as is consistent with accepted engineering practice; however, a skilled person will understand that the illustrated components are readily understood when viewed in the context of the illustration as a whole and the accompanying disclosure describing such various figures.

DETAILED DESCRIPTION

The Figures and Detailed Description signify, only to provide knowledge and understanding, the claimed inventions. To minimize the length of the Detailed Description, while various features, structures or characteristics can be described together in a single embodiment, they also can be used in other embodiments without being written about. Variations of any of these elements, and modules, processes, machines, systems, manufactures or compositions disclosed by such embodiments and/or examples are easily used in commerce. The Figures and Detailed Description also can signify, implicitly or explicitly, advantages and improvements of the claimed inventions and their embodiments for use in commerce.

In the Figures and Detailed Description, numerous specific details can be described to enable at least one embodiment of the claimed inventions. Any embodiment disclosed herein signifies a tangible form of a claim invention. To not obscure the significance of the embodiments and/or examples in this Detailed Description, some elements that are known to a skilled person can be combined together for presentation and for illustration purposes and not be described in detail. To not obscure the significance of these embodiments and/or examples, some well-known processes, machines, systems, manufactures or compositions are not written about in detail. However, a skilled person can use these embodiments and/or examples in commerce without these specific details or their equivalents. Thus, the Detailed Description focuses on enabling the distinctive elements of the claimed inventions and exemplary embodiments. Where this Detailed Description refers to some elements in the singular tense, more than one element can be depicted in the Figures and like elements are labeled with like numerals.

Detailed Description—Exemplary Memory Structure

Figure 1A:
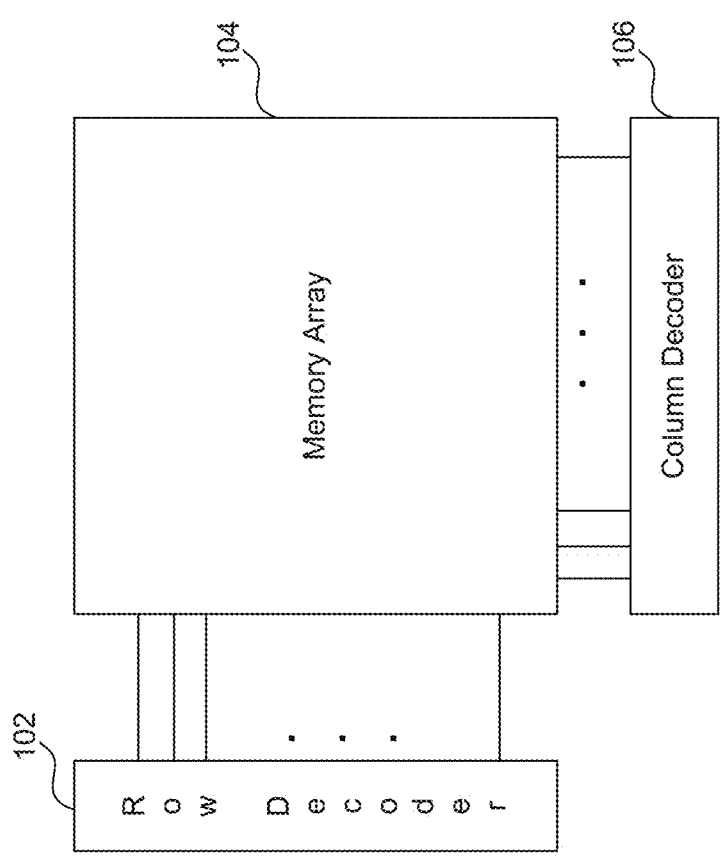
FIG. 1A illustrates a memory structure.

FIG. 1A is an exemplary memory structure that may include a memory array 104, a row decoder 102, and a column decoder 106. The memory structure shown in FIG. 1A may be any type of memory, for example, a random access memory (RAM), a read only memory (ROM), etc. The RAM may be either static RAM (SRAM) or dynamic RAM (DRAM). By way of non-limiting example, the memory array 104 may store $2^n$ words of $2^m$ bits each. Accordingly, the memory array 102 may be a matrix, where N may represent a number of rows of the memory array 102 that are also known as WLs, and M may represent number of columns of the memory structure 102 that are also known as bitlines (BLs). A specific memory element at a specific row and a column position may be referenced by using a specific binary address. The specific binary address may be selected using a row decoder 102 and a column decoder 106.

The row decoder 102 based on input at the address bus bits may select a memory element of a particular row, and the column decoder 106 based on the input at the address bus bits may select a specific word or section of the selected row. The memory structure shown in FIG. 1 may have other components such as sense amplifier(s), etc. The row decoder and the column decoder may be implemented using NAND gate or NOR gate. The row decoder may be implemented as hierarchical decoders or cascaded decoders. The column decoder may be implemented using a MUX. As described above, in SRAM, the WL is connected to pass gate of the bitcell and is routed over a wide bitcell array and faces the issue of high wire RC delay for wider memories. As known to a person skilled in the art, FinFET node may comprise many metal layers, and the resistance of lower metal layer may severely impact the RC delay.

As described above, an effective RC delay increase in 7 nm FinFET node is about 20% compared to 16 nm FinFET. To mitigate or compensate this increased wire resistance impact, a WL of a memory array may be segmented into a plurality of memory segments with each WL driver driving corresponding memory segment of the plurality of memory array segments. When the memory array is segmented into multiple smaller memory array segments, it improves performance at the expense of degrading area efficiency as described in references [1] and [2] listed below. By way of non-limiting example, when CPS exceeds 256, a WL of the memory array may be divided into two memory segments till CPS equals to 512. For CPS, greater than 512 and till 640, the WL of the memory array may be divided into three segments. This approach of re-buffering WL to improve WL RC delay may impact area efficiency. This impact on area is particularly worse at break points such as when CPS is just greater than 256 (when array is divided into two segments) and CPS just greater than 512 (when array is divided into three segments). The objective of this disclosure is to provide area efficient and high-performance WL segmented architecture. Further, the disclosure refers to 7 nm FinFET SRAM for discussion and can be extended to any FinFET technology. However, a person skilled in the art may recognize that this disclosure may be applied to other technology nodes as well. Accordingly, the claims are not limited a particular technology node.

Detailed Description—SRAM in 7 Nm FinFEt Node

Figure 1B:
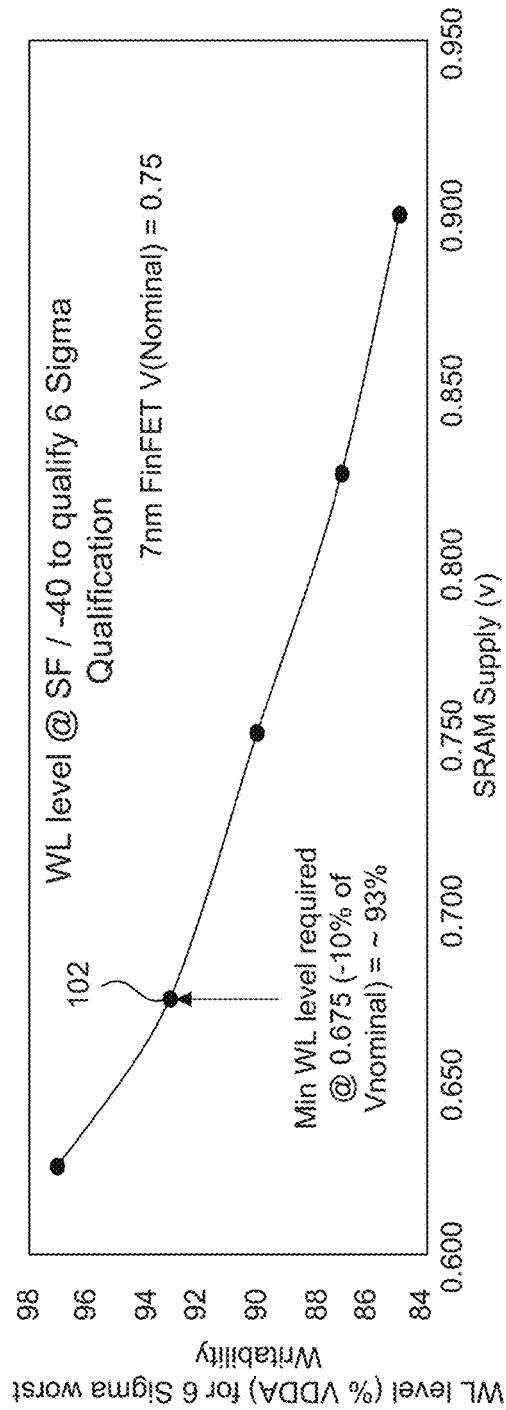
FIG. 1B illustrates WL requirement for six sigma qualification.

FIG. 1B illustrates WL requirement for six sigma qualification. In bulk CMOS technology nodes, the delay of electronic chips was dominated by driver strength driving the global signals, i.e., WL and bitline (BL) signals in SRAM compiler. The resistivity of copper (Cu) wires increases rapidly at small dimensions due to increased electron scattering at the grain boundaries and surfaces as described in reference [3] through [5] listed above. This adverse impact on scaling of the resistance, and the resultant increased delay of wires may prevent designers from fully exploiting the improvement in the intrinsic device performance. As the interconnect dimensions shrink toward the 7-nm technology node, the impact of the resistance increase in metal lines limits the gain offered by technology especially for wider memories as described in references [3] through [5] listed above. The signal waveform at the far end and near end of the WL and BL drives differ making farther bitcell more prone to a failure. Minimum WL level required for six sigma qualification across voltage range is shown in FIG. 1B.

In FIG. 1B, a graph 100 for a WL for worst writability is shown. The Y-axis represents percentage of VDDA (% VDDA) and X-axis represents SRAM voltage supply. The graph 100 corresponds to a slow nmos—fast pmos (SF) corner at a low temperature of −40 degree Celsius. A nominal voltage level for 7 nm FinFET node is about 0.75 volt. For six sigma qualification, a minimum WL voltage level 102 required is approximately 0.675 volt, which is about 10% lower than the nominal voltage of 0.75 volt. A person skilled in the art may recognize that the increased wire resistance may cause a drop in the voltage at a far end of the WL. Such a voltage deterioration at far end may be difficult for improving the driver strength. Increasing driver strength devices may give marginal gain but may impact area and leakage specifications of the memory compiler. Improving the driver strength may therefore not be a correct option to fix a WL or BL RC issue. This is evident based on waveforms shown in FIG. 2b for a WL strapping scheme without rebuffering for 512 CPS in 7 nm FinFET node as shown in FIG. 2a.

Figure 2A:
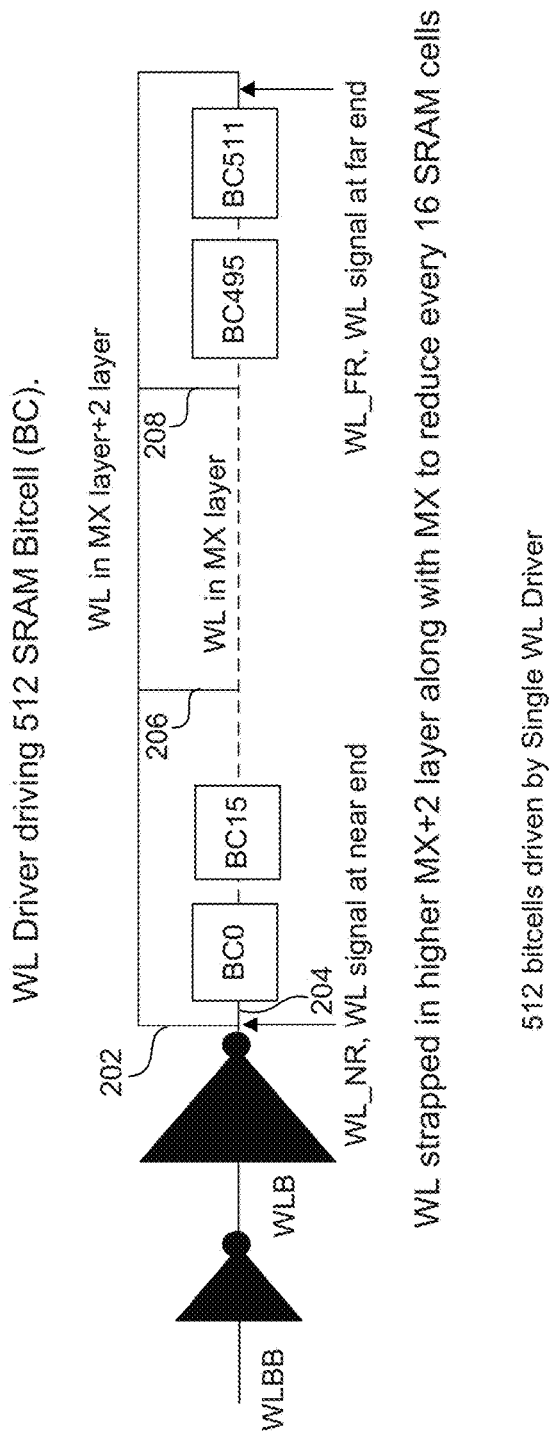
FIG. 2a illustrates a WL-strapping scheme.

FIG. 2a illustrates a WL-strapping scheme without re-buffering. As can be seen in FIG. 2a, the WL decoder signal may be strapped in a higher metal track 202 in parallel with a lower metal track 204. The higher metal track 202 may be a third layer and a lower metal track 204 may be a first layer. A single WL driver drives 512 SRAM bitcell (BC) without re-buffering. However, as shown in FIG. 2a, the WL strapped in the higher metal track 202 may be used to bolster the driver signal in the lower metal track 204, for example, at every 16 SRAM bitcells as shown at 206 and 208.

Figure 2B:
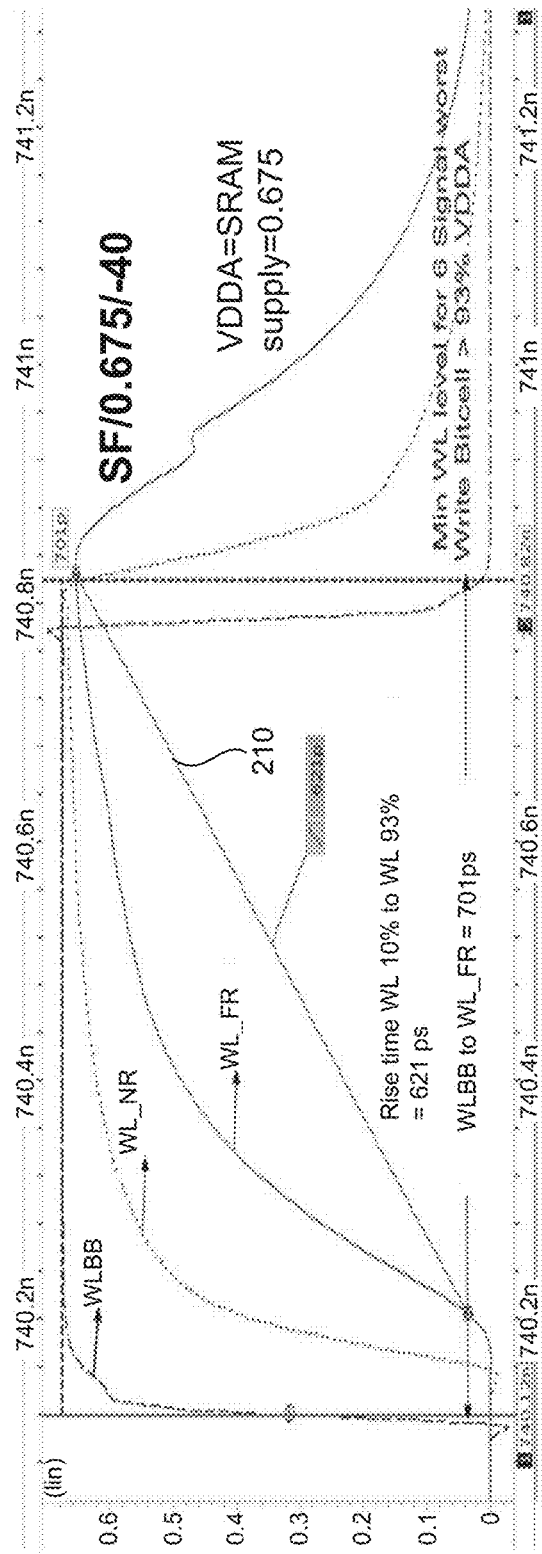
FIG. 2b illustrates performance of a WL-strapping scheme without re-buffering for CPS=512 in 7 nm FinFET node.

As shown in FIG. 2b, when a WL of 512 CPS is driven by a single WL driver, the slope 210 of WL signal may be greater than 600 ps that makes the design excessively slow. By way of non-limiting example, delay from WL pre-driver to WL at the far end may be ~700 ps.

Comparing the waveforms shown in FIG. 2b for performance of WL strapping scheme with re-buffering for 512 CPS in 7 nm FinFET node as shown in FIG. 2a shows that breaking the segment of wider memory into multiple segments may improve performance significantly.

Figure 3A:
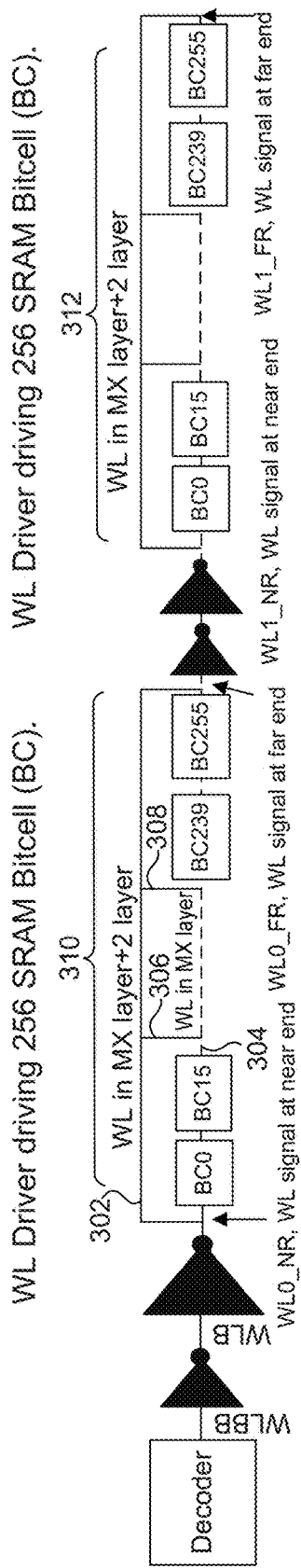
FIG. 3a illustrates a WL-strapping with re-buffering scheme.

FIG. 3a illustrates a WL strapping scheme with re-buffering. Like FIG. 2a, FIG. 3a shows a WL 300 of 512 bitcells. A WL decoder signal may be strapped in a higher metal track 302 in parallel with a lower metal track 304 as described above. The higher metal track 302 may be a third layer and a lower metal track 304 may be a first layer. Similar to the WL as shown in FIG. 2a, the WL 300 strapped in the higher metal track 302 may be used to bolster the driver signal in the lower metal track 304, for example, at every 16 SRAM bitcells as shown at 306 and 308. However, the WL of 512 bitcells is divided into two segments 310 and 312. And, the WL driver signal for $256^{th}$ through $512^{th}$ bitcells, i.e., the second segment 312, may be driven by a re-buffered signal.

Figure 3B:
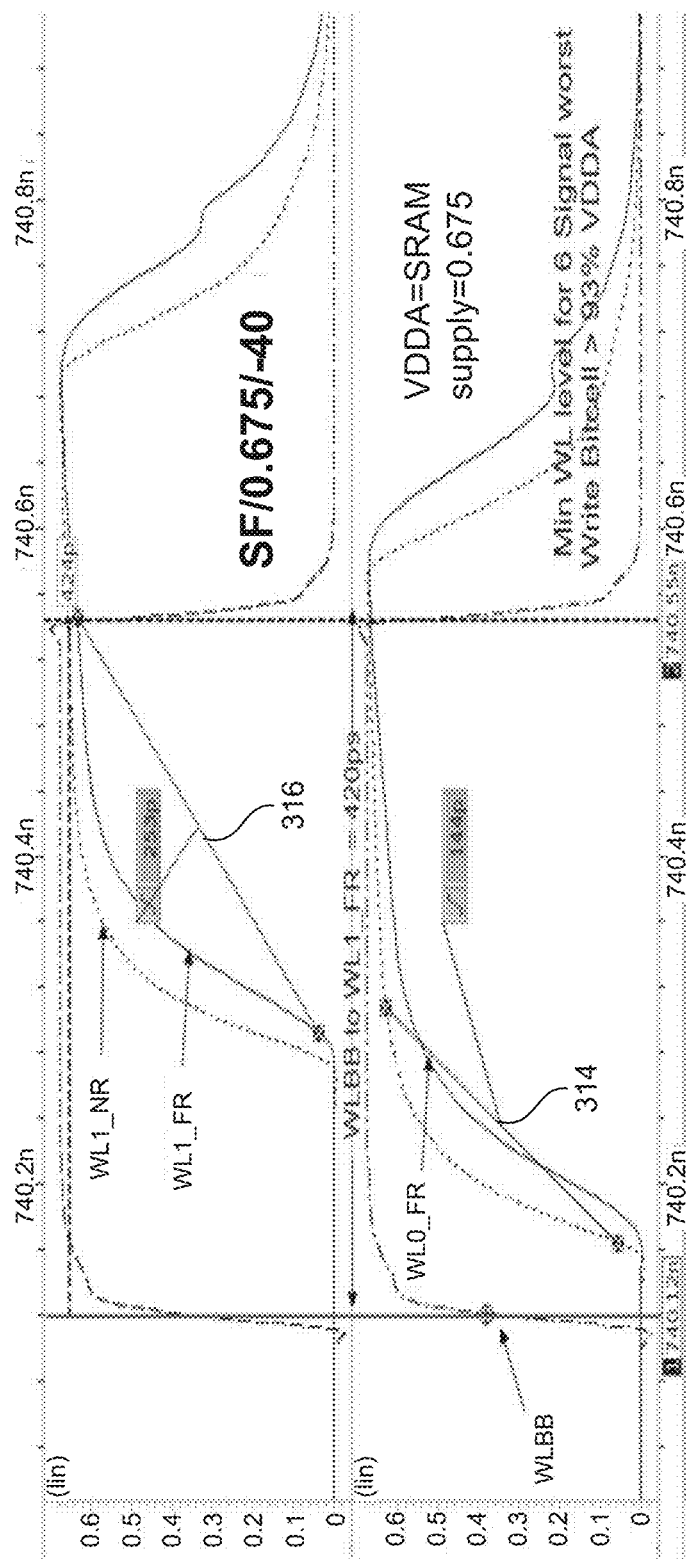
FIG. 3b illustrates performance of a WL-strapping scheme with re-buffering for CPS=512 in 7 nm FinFET node, according to an exemplary embodiment of the present disclosure.

FIG. 3b illustrates performance of a WL-strapping scheme with re-buffering for CPS=512 in 7 nm FinFET node, according to an exemplary embodiment of the present disclosure. As shown in FIG. 3b, the slope 314 for the WL at near end of driver is 144 ps that is increased to 253 ps as the slope 316 for the WL at the far end of the driver at the end of the first segment. Here, slope value is calculated from 10% to 93% VDD. The slope is measured to reach 0.675 volt voltage level required for six sigma qualification. The slope value here increases by 80%.

Accordingly, an additional re-buffering may reduce the slope of the WL signal at the $512^{th}$ bitcell to about 253 ps instead of about 621 ps, which may occur when the WL driver signal is not re-buffered. Thus, breaking the segment of wider memory into multiple segments may improve the performance significantly. A table below summarizes impact on area efficiency and delay at the far end of the WL based on re-buffering of the WL driver signal and number of segments for a WL of different CPS range.

herein that overcomes the issue of additional two inverter delay of re-buffering approach.

By way of non-limiting examples, a WL of three different CPS range are described that demonstrates performance and area efficiency of WL segmented architecture in accordance with the embodiments described herein. Three CPS ranges may be less than 256 CPS, greater than 256 CPS but not greater than 512 CPS, and greater than 512 CPS but not greater than 640 CPS.

Figure 4:
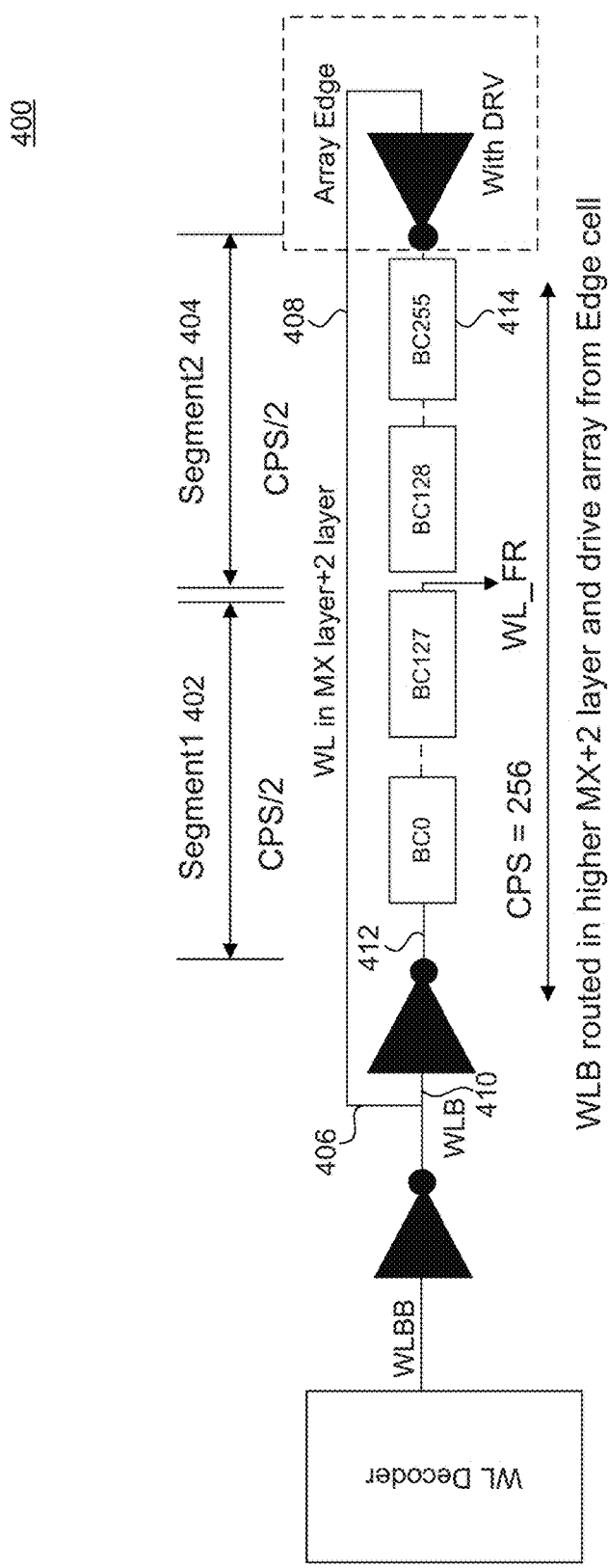
FIG. 4 illustrates an edge driver implementation, according to an exemplary embodiment of the present disclosure.

FIG. 4 illustrates an edge driver implementation, according to an exemplary embodiment of the present disclosure. By way of non-limiting example, as shown in FIG. 4, the WL 400 is of 256 CPS, which may be divided into two segments, segment 1 402 and segment 2 404. Segment 1 402 and segment 2 404 both may be of the equal bitcell width of CPS/2. Since, the WL 400 is of 256 CPS, each segment may be of 128 CPS, i.e., may include 128 columns of a bitcell. Further, an inverted WL driver signal WLB 406 may be routed in a higher metal track 408 to drive the segment 404. The inverted WL driver signal WLB 406 may be routed in the higher track 408 in parallel with the WL driver signal 410 in the lower track 412. The WL driver signal 410 may drive the segment 1 402 at bitcell at position 0, and the inverted WL driver signal WLB 406 may drive the segment 2 404 at bitcell at position 255. Bitcell position 0 and bitcell position 255 corresponding to the segment 1 402 and segment 2 404 may be referenced as a first end for the segment 1 402 and segment 2 404 respectively. And, a bitcell at position 127 and a bitcell at position 128 may be referenced as a second end for the segment 1 402 and segment 2 404 respectively. The first end may also be referenced as near end of the WL segment, and the second end may also be referenced as far end of the WL segment. For the WL

TABLE 1

Impact of Re-buffering on Performance and Area Efficiency at SF/−40/0.675

| CPS Range | Re-Buffer | Effective Segment | Impact on bit cell area efficiency | Delay(WLBB to worst WL RC Delay) picoseconds (PS) |
|---|---|---|---|---|
| 32 < CPS <= 256 | 0 | 1 | No impact | 286 |
| 256 < CPS <= 512 | 0 | 1 | No impact | 700 |
| 256 < CPS <= 512 | 1 | 2 | 4% (CPS = 260) | 424 |
| 512 < CPS <= 640 | 0 | 1 | No impact | 1040 |
| 512 < CPS <= 640 | 1 | 2 | 2.5% (CPS = 512) | 483 |
| 512 < CPS <= 640 | 2 | 3 | 5% (CPS = 516) | 542 |

Based on table 1 above, it is evident that breaking segments to gain performance may degrade area efficiency about 5%.

Detailed Description—Exemplary Wordline Segmented Architecture

From the above discussion, it may be concluded that WL-strapping may not be an effective solution for lower CPS range. WL-strapping may not provide improved performance when the WL of the memory array may extend above 192 CPS. While breaking the WL array into sub-segments may improve the performance as the WL rise time improves more than 2×. However, effective performance improvement may reduce as re-buffering may invariably introduces delay of two inverters.

In accordance with some embodiments, by way of non-limiting example, in 7 nm SRAM design, a more effective WL segment architecture may be implemented as described array 400 of 256 CPS, the bitcell at position 255 may also be referenced as an Edge cell 414. Accordingly, the WL 400 of 256 CPS shown in FIG. 4 may be driven from two ends of the WL.

While instances that generally become bottleneck for high speed application are mostly instance around CPS of 256. However, the WL 400 as shown in FIG. 4 may offer the advantage of achieving ultra-high speed for CPS up to 256. With this implementation, performance for CPS till 256 may be improved with minimal area impact. By way of non-limiting example, a WL constructed as shown in FIG. 4 may be comparable with re-buffering and WL-strapping in performance till around 384 CPS without adversely affecting area efficiency because no separate WL driver (WLDRV) section may be required. In this approach, the SRAM Edge cell 414 may be combined with the WL driver and hence area wastage resulting from insertion of WL DRV cell is avoided. When array is broken to insert periphery logic (like WLDRV/Re-buffer), major area overhead is there because the array needs termination Edge cells that partition array and periphery. As a person skilled in the art may know, the area of these SRAM Edge cells may be reasonably large.

Figure 5:
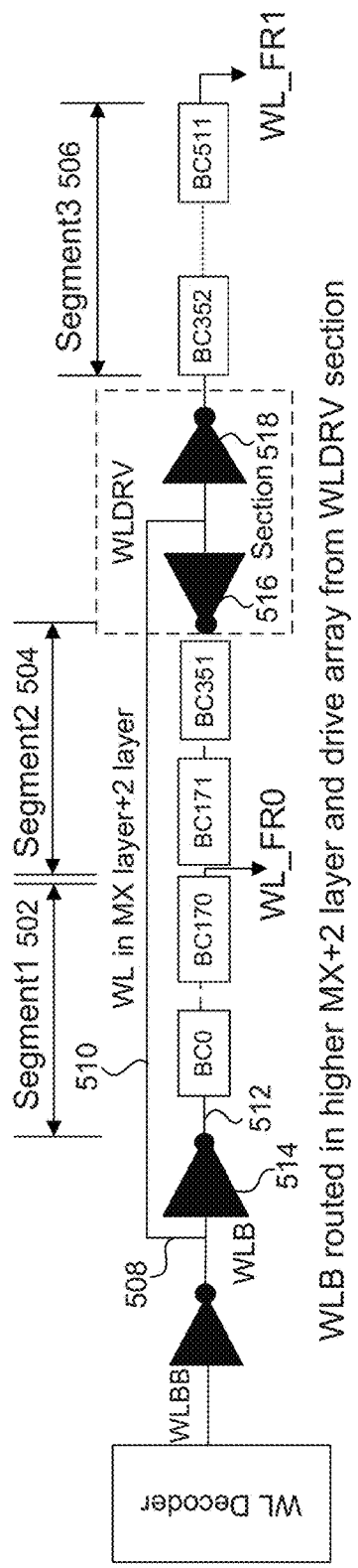
FIG. 5 illustrates a high-speed WL segmentation implementation, according to an exemplary embodiment of the present disclosure.

FIG. 5 illustrates a high-speed WL segmentation implementation, according to an exemplary embodiment of the present disclosure. By way of non-limiting example, the WL 500 shown in FIG. 5 is of CPS between 256 and 512. The WL 500 as shown in FIG. 5 may offer the flexibility of improved performance for same area as compared to the single re-buffering scheme. As shown in FIG. 5, the WL 500 of 512 CPS is divided into three segments. A first segment, segment 1 502, is of 171 CPS, a second segment, segment 2 504, is of 181 CPS, and a third segment, segment 3 506, is of 160 CPS. Accordingly, one segment may be of different CPS size than the other segment. By way of non-limiting example, for a WL of total size X CPS, the first segment 502 may be of size (X/3+a), the second segment 504 may of size (X/3+b), and the third segment 506 may of size (X/3−(a+b)). The value of a and b may be a function of (WL RC delay in the lower metal layer minus WL RC delay in the upper metal layer). The value of a and b may be determined based on simulations.

A WL driver driving a corresponding WL segment may be of different strength than another WL driver driving another WL segment of the same WL. WL driver strength of each WL driver may be determined based on simulations and may be a function of (WL RC delay in the lower metal layer minus WL RC delay in the upper metal layer).

As shown in FIG. 5, an inverted WL driver signal (WLB) 508 may be routed in higher metal track 510 in parallel with lower metal track 512. The WLB 508 may drive the second segment 504 and the third segment 506 from a bitcell at position 351 and 352 respectively. As described earlier with reference to FIG. 4, a bitcell at position 0, a bitcell at position 351, and a bitcell at position 352 may correspond to a first end for the segments segment 1 502, segment 2 504, and segment 3 506 respectively. And, a bitcell at position 170, a bitcell at position 171, and a bitcell at position 511 may correspond to far end for the segments segment 1 502, segment 2 504, and segment 3 506. WL drivers 514, 516, and 518 drives segment 1 502, segment 2 504, and segment 3 506 at the first end corresponding to the segment 1 502, segment 2 504, and segment 3 506.

For the WL 500 of FIG. 5, area impact is comparable with the re-buffering scheme due to three segments and three WL drivers required, and with better performance compared to the re-buffering scheme. The performance improvement over re-buffering scheme may be as a result of no delay that may occur in re-buffering scheme because of two additional inverters that are required. Table 2 below shows RC comparison for WL driver signal in the higher layer versus the lower layer. The RC delay in the higher level metal track is significantly less compared to RC delay in lower level metal track.

TABLE 2

RC comparison of WL and WLB signal

| SIGNAL | LAYER | Capacitance (fF) | Resistance | Delay RC |
|---|---|---|---|---|
| WLB | MX + 2 | 0.18C | 0.85R | 0.15*R*C |
| WL | MX | C | R | R*C |

WLB Signal is almost 7 times faster as compared to WL Signal.

For a WL of up to 512 CPS, when the WLB signal is routed till 352 CPS as shown in FIG. 5, the worst delay for the WLB signal at SF/0.675/−40 may be less than an inverter delay. Accordingly, performance boost may be obtained when the WL array may be divided into three segments without penalizing area as shown in FIG. 5.

Figure 6:
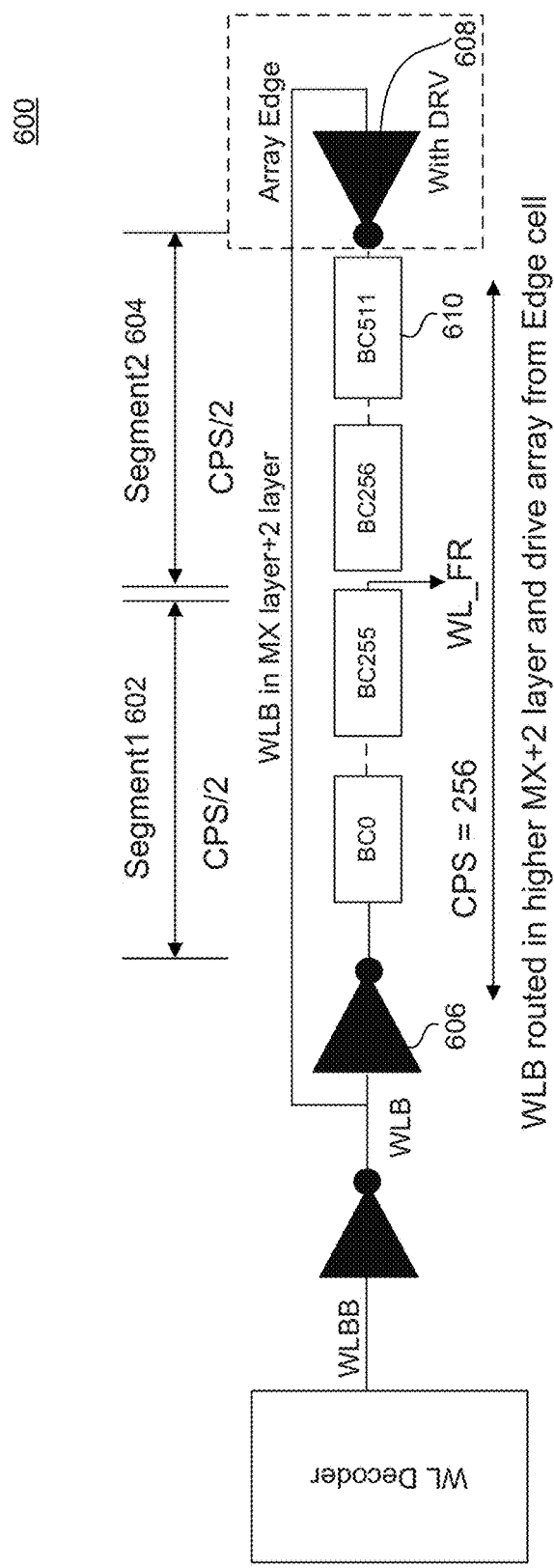
FIG. 6 illustrates an area efficient WL segmentation implementation, according to an exemplary embodiment of the present disclosure.

FIG. 6 illustrates an area efficient WL segmentation implementation, according to an exemplary embodiment of the present disclosure. A WL 600 shown in FIG. 6 is no different from a WL shown in FIG. 4, except CPS in memory array segment for memory array segments segment 1 602 and segment 2 604 in FIG. 6 are higher than CPS for the memory area segments segment 1 402 and segment 2 404 as shown in FIG. 4. Since the WL shown 600 in FIG. 6 is of 512 CPS, segments segment 1 602 and segment 2 604 are of 256 CPS. In comparison with a WL of 512 CPS shown in FIG. 5, the WL shown in FIG. 6 has only two WL drivers 606 and 608. Accordingly, there is no impact on area when compared with the WL shown in FIG. 5. Further, the SRAM Edge cell 610 may be combined with the WL driver 608 and area wastage resulting from insertion of WL driver cell may be avoided. The WL as shown in FIG. 6 may provide area efficiency without compromising performance compared to re-buffering and WL-strapping scheme described above.

Figure 7:
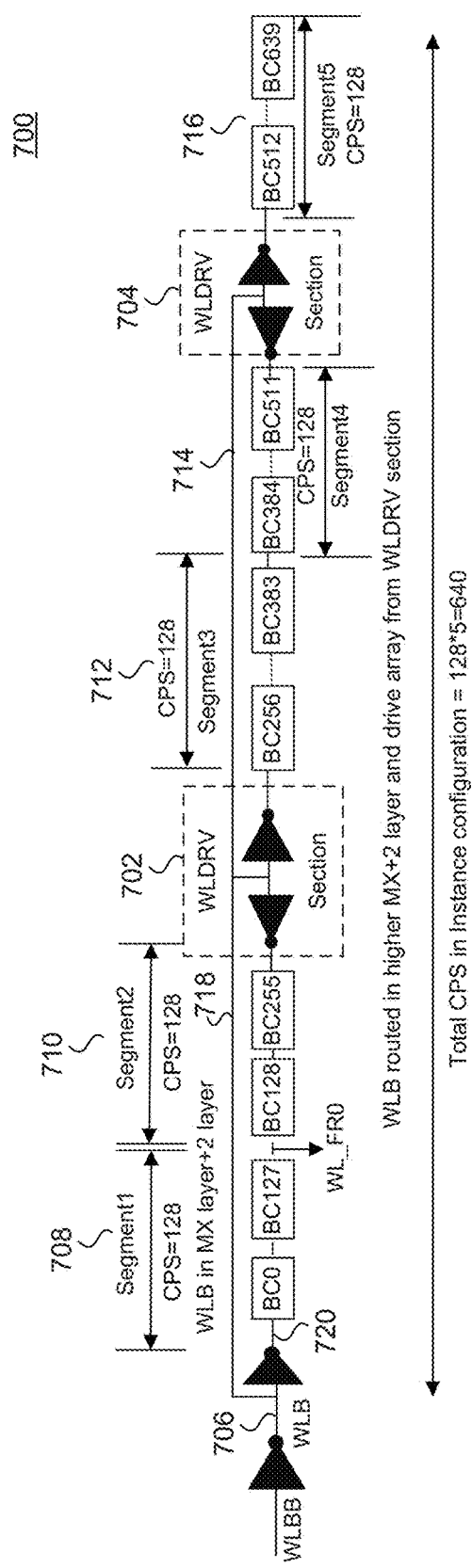
FIG. 7 illustrates a WL implementation, according to an exemplary embodiment of the present disclosure.

FIG. 7 illustrates a WL implementation, according to an exemplary embodiment of the present disclosure. By way of non-limiting example, a WL 700 shown in FIG. 7 is of CPS greater than 512 but not greater than 640. The WL 700 as shown in FIG. 7 may provide both area and performance advantage over re-buffering scheme where two re-buffered sections may be inserted for optimal performance. For wider SRAM configuration, i.e., a WL of greater than 512 CPS but less than 640 CPS, two WLDRV sections 702 and 704 may be used and WLB signal 706 may be routed till 4*CPS/5, effectively dividing the WL into five segments. For wider configuration of 640 CPS configuration, a WL driver may drive 128 SRAM bitcells. When a WLDRV segment drives 128 CPS bit cell capacitance, the signal rise and fall measures may be comparable to an inverter delay, and may help to achieve major gain in access time for the wider configuration. To gain speed for wider CPS, i.e., beyond 512 CPS, two WLDRV sections may be used that may have almost similar area impact of re-buffering scheme but performance may be superior to re-buffering and WL-strapping implementation.

By way of non-limiting example, the WL 700 shown in FIG. 7 may be of 640 CPS, and divided into five segments 708, 710, 712, 714, and 716, each of 128 CPS. The WLB signal 706 as described above may be routed in the higher level metal track 718 up to 512 CPS, where segment 2 710, segment 3 712, segment 4 714, and segment 5 716 are driven by WLB signal 706 in the higher level metal track 718. As described above with reference to other WLs, bitcells at position 0, 255, 256, 511, and 512 are first ends of the corresponding memory array segments segment 1 708, segment 2 710, segment 3 712, segment 4 714, and segment 5 716, while bitcells at position 127, 128, 383, 384 and 639 are second ends of the corresponding memory array segments segment 1 708, segment 2 710, segment 3 712, segment 4 714, and segment 5 716. The second end of the memory segment may be coupled to the second end of the adjacent memory segment of the WL, which may be a row of a plurality of rows of a memory array. As described above, the WL 700 shown in FIG. 7 would offer advantage of high performance because of each memory segment is being driven by a WLDRV at the first end of the memory segment. The WLDRV is driven by a WLB signal in a higher level metal track which offer much less wire resistance compared to the lower level metal track. Since the WL 700 shown in FIG. 7 may include two WLDRV sections 702 and 704 driving the segments 2 through the segment 5, the WL 700 of FIG. 7 may offer high performance at a cost of area efficiency.

As described above, one segment of the WL of FIG. 7, may be of different CPS size than the other segment. As described above, each segment size may be determined based on simulations and may be a function of (WL RC delay in the lower metal layer minus WL RC delay in the upper metal layer).

Figure 8:
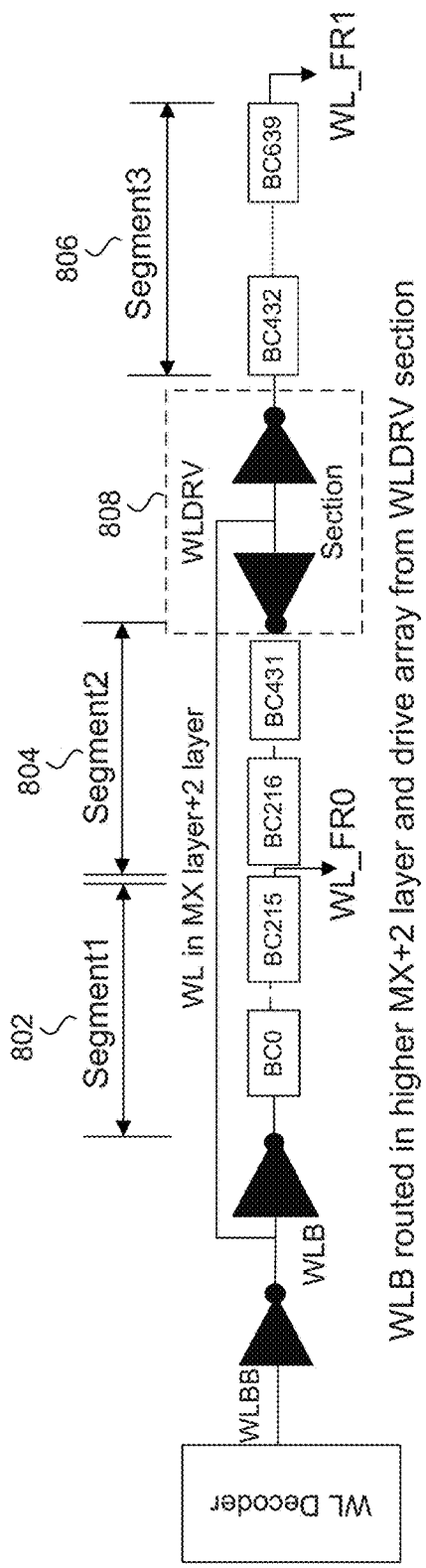
FIG. 8 illustrates a WL implementation, according to an exemplary embodiment of the present disclosure.

FIG. 8 illustrates a WL implementation, according to an exemplary embodiment of the present disclosure. As described above with reference to FIG. 6, the WL of 640 CPS is divided in to three segments 802, 804, and 806 requiring only one WLDRV section 808 instead of two WLDRV sections. Accordingly, the WL 800 of FIG. 8 may offer benefit of area efficiency with comparable performance.

Detailed Description—Exemplary Timing Scheme for Worldline Segmented Architecture The WLs in the memory array may have almost similar RC delay, however, PVT variation may result in the large WL RC delay variation. Accordingly, there is a need to synchronize signals for WL enabling and other memory peripherals. To obtain best time timing, a dummy WL may be implemented. The dummy WL is replica of an actual WL that may be used to reset the WL at optimal in different PVT condition. When the reference WL is enabled, an actual WL may also be enabled and stays enabled for the period for which the reference WL stay enabled. Thus, the reference WL may typically determine the on duration of the actual WL. This may be evident from FIG. 9 and FIG. 10 as discussed below.

Figure 9:
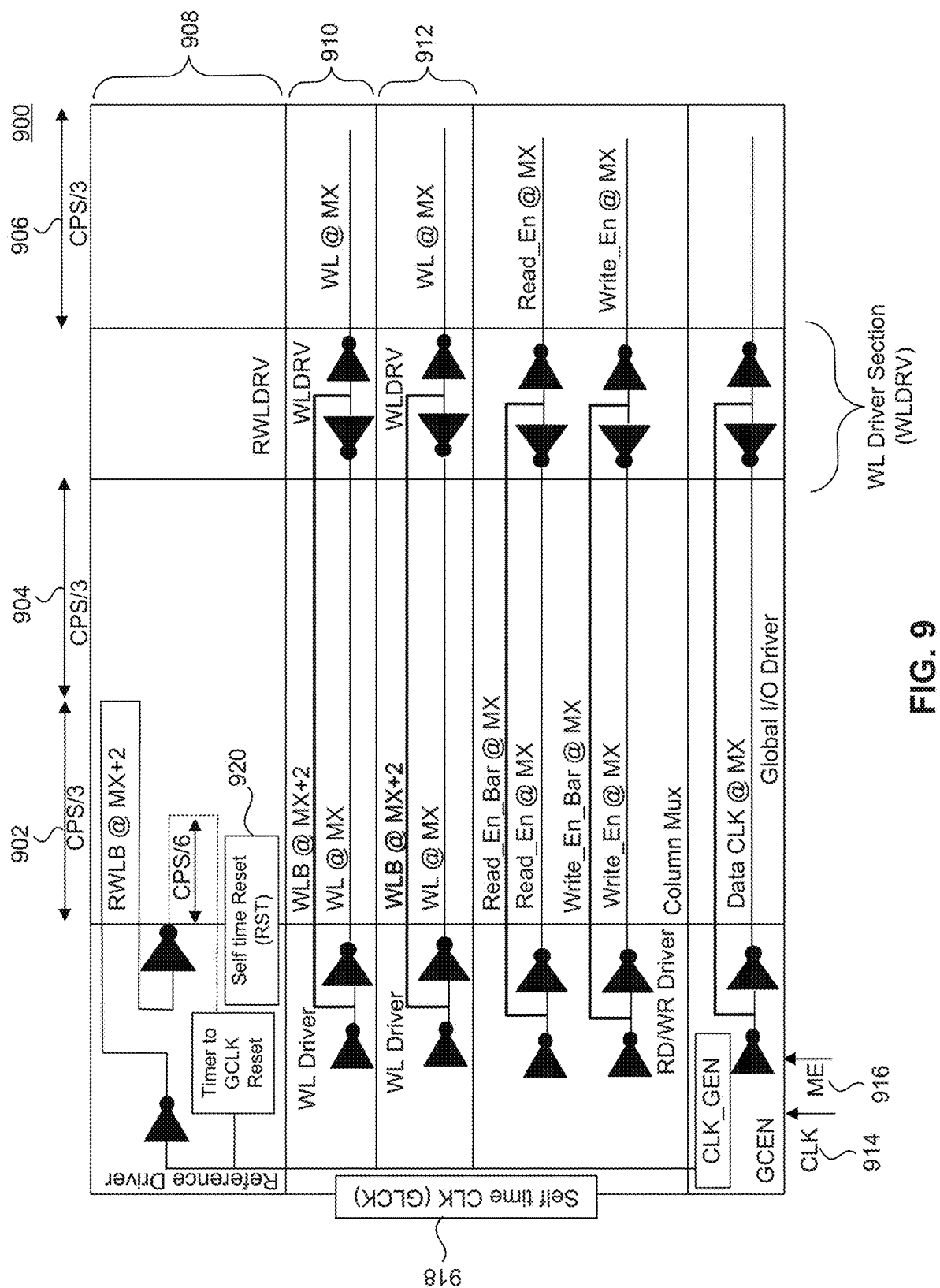
FIG. 9 illustrates an architecture block level diagram, according to an exemplary embodiment of the present disclosure.
Figure 10:
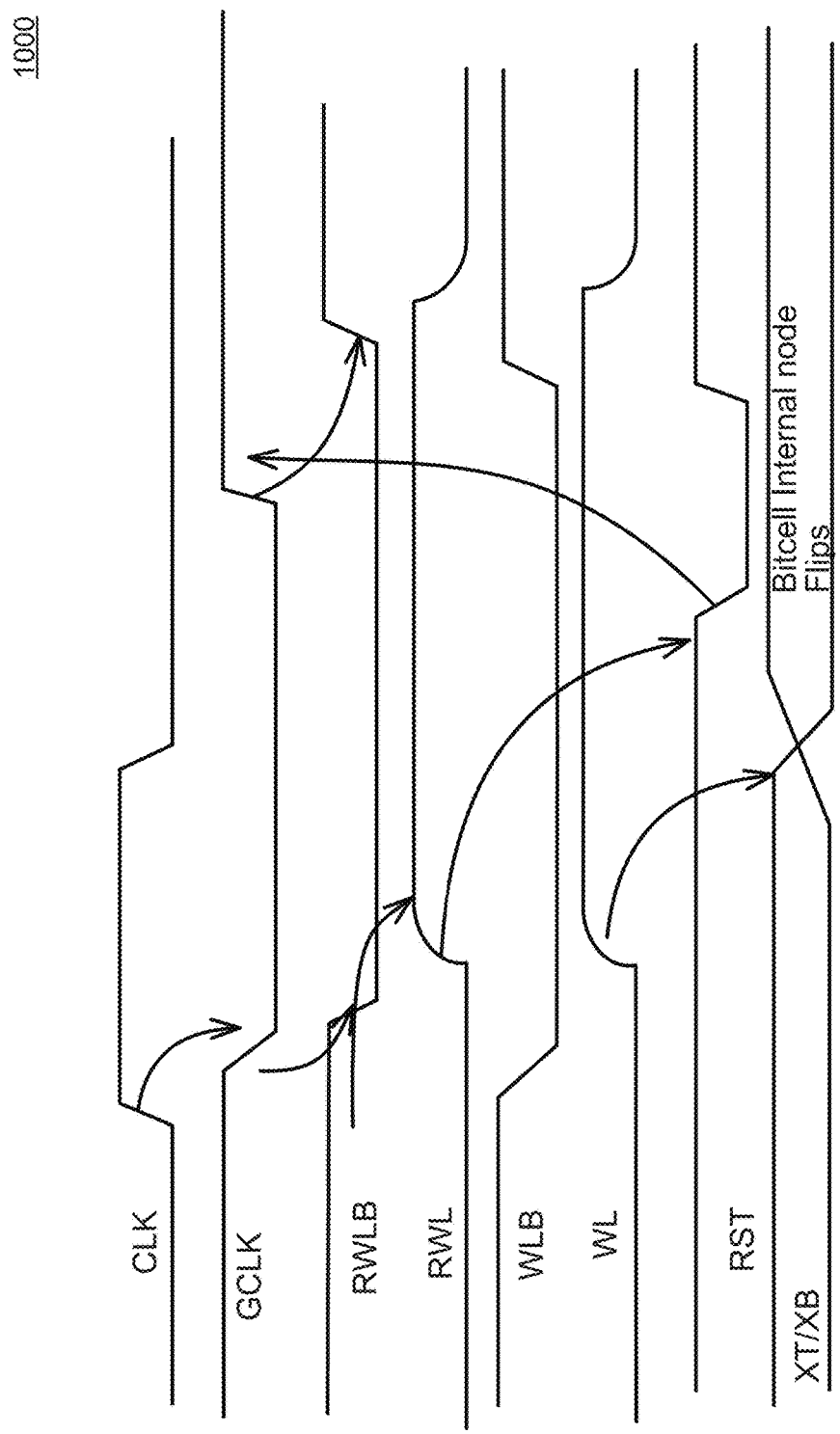
FIG. 10 illustrates a signal flow diagram for write operation, according to an exemplary embodiment of the present disclosure.

FIG. 9 illustrates an architecture block level diagram, according to an exemplary embodiment of the present disclosure. WLs of a memory array 900 shown in FIG. 9 are segmented into three segments 902, 904, and 906, each of size CPS/3. Accordingly, WLs shown in FIG. 9 may be similar to the WL shown in FIG. 5. Similar to the actual WL implementation, the reference WL 908 may be generated to closely track the RC delay of WLs 910 and 912. As can be seen in FIG. 10, RWLB signal mimic the WLB signal of the memory array and its delay varies with the CPS of the WL. The memory array 900 may run on an external clock 914, and when the memory is enabled with ME=1 signal 916, self-time clock (GCLK) 918 may be generated that may turn on, for example, the reference WL 908 and WL 910, at the same time. Reference wordline reset (WL RST) may reset the GCLK at the end of read/write operation. WL RST may be generated based on a delay circuit shown in FIG. 9 as 920.

A waterfall diagram 1000 for write operation may be as shown in FIG. 10. As discussed above, the GCLK 918 signal may be triggered when the memory enabled signal ME is set to 1. As described above, RWLB signal mimics WLB signal, and RWL and WL stays enabled together. When a WL RST signal is generated, based on the delay circuit shown in FIG. 9, the WL RST signal may cause GCLK signal to flip, which may cause the RWL and WL to be disabled.

Figure 11:
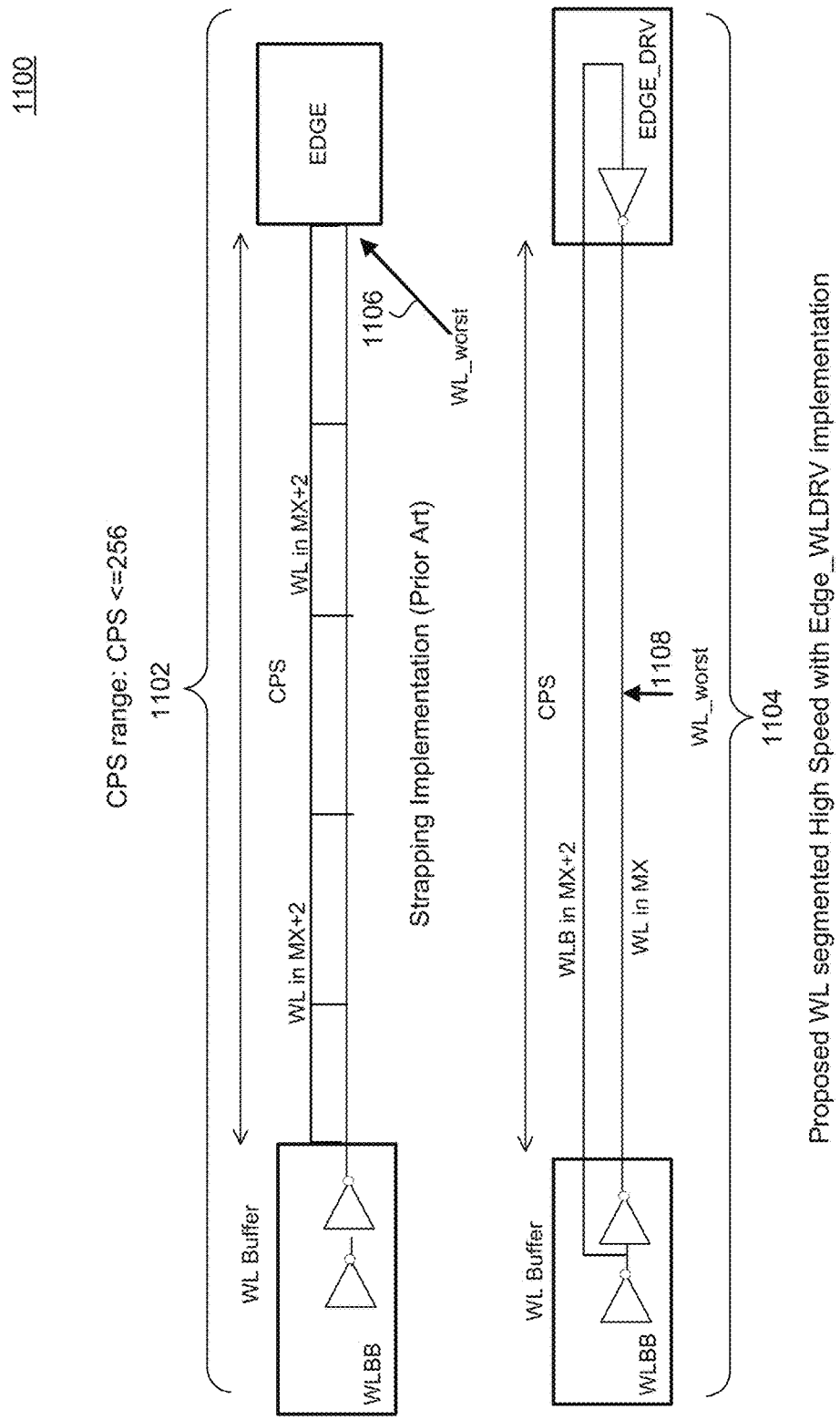
FIG. 11 illustrates a schematic representation of WL-strapping versus WL segmentation implementation according to an exemplary embodiment of the present disclosure.

Detailed Description—Simulation Results for Write Operation for the Exemplary Wordline Segmented Architecture In the following section, simulation results for write operation for different CPS configuration for WL as described herein are compared with re-buffering scheme and WL-strapping scheme. Based on the simulation results, major gain has been observed in a write operation. For the WL as described above with reference to FIG. 4 is compared with a WL with WL strapping scheme. When WL driver WLDRV section is merged with SRAM Edge cell, gain in speed may be observed with minimal impact on area. FIG. 11 illustrates a WL 1102 with WL-strapping, and a WL 1104 as shown in FIG. 4. As shown in FIG. 11, the worst slope may be observed at the Edge 1106 for the WL 1102 with WL-strapping, whereas the worst slope may be observed at the center 1108 of the WL 1104 for the WL as shown in FIG. 11.

Figure 12:
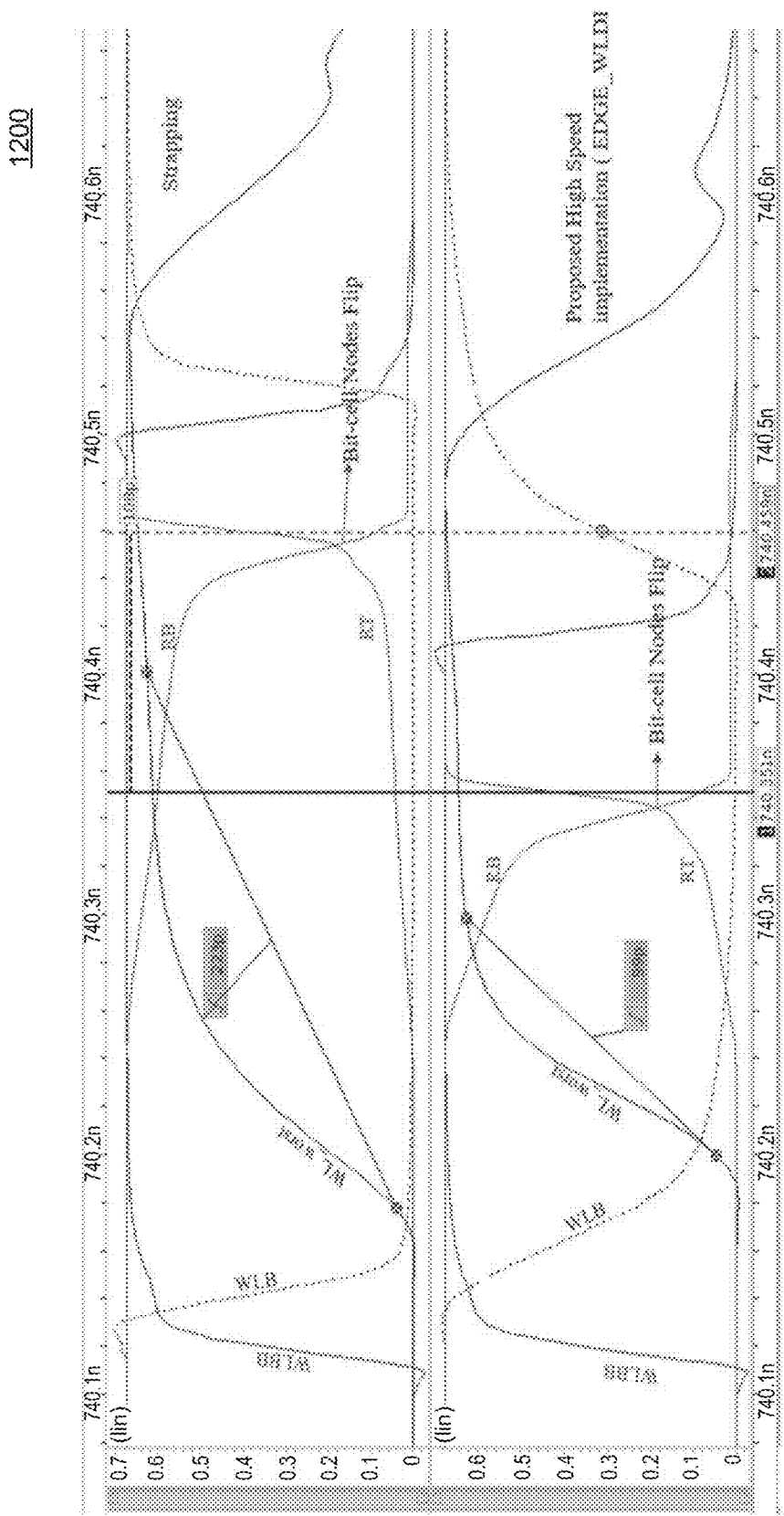
FIG. 12 illustrates a waveform comparison of WL-strapping versus WL segmentation implementation according to an exemplary embodiment of the present disclosure.

FIG. 12 shows waveform comparison 1200 of WL-strapping versus WL segmented architecture as disclosed herein with reference to FIG. 11. The table below may summarize performance comparison.

TABLE 3

Comparison analysis for CPS <= 256 @ SF/−40/0.675 v
Performance and Area Impact Comparison (Prior vs. WL Segmented Architecture) @ CPS <= 256

| Design Implementation | WLBB to Bit-cell Flip (ps) | WL Slop (ps) | Area Impact (%) |
|---|---|---|---|
| Strapping | 335 | 220 | No impact |
| With EDGE_WLDRV (High Speed) | 224 | 99 | 0.5% |

Figure 13:
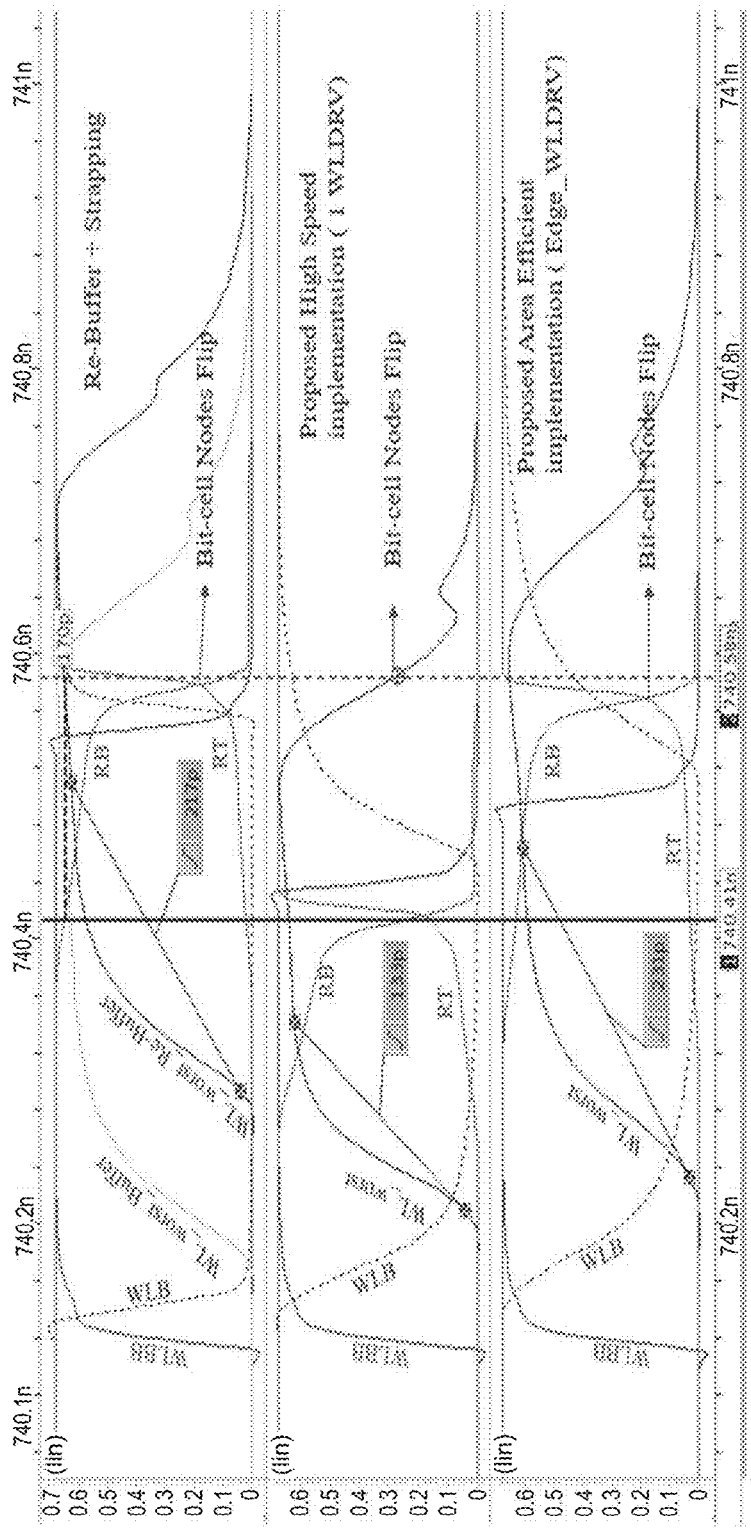
FIG. 13 illustrates a comparison analysis, according to an exemplary embodiment of the present disclosure.
Figure 14:
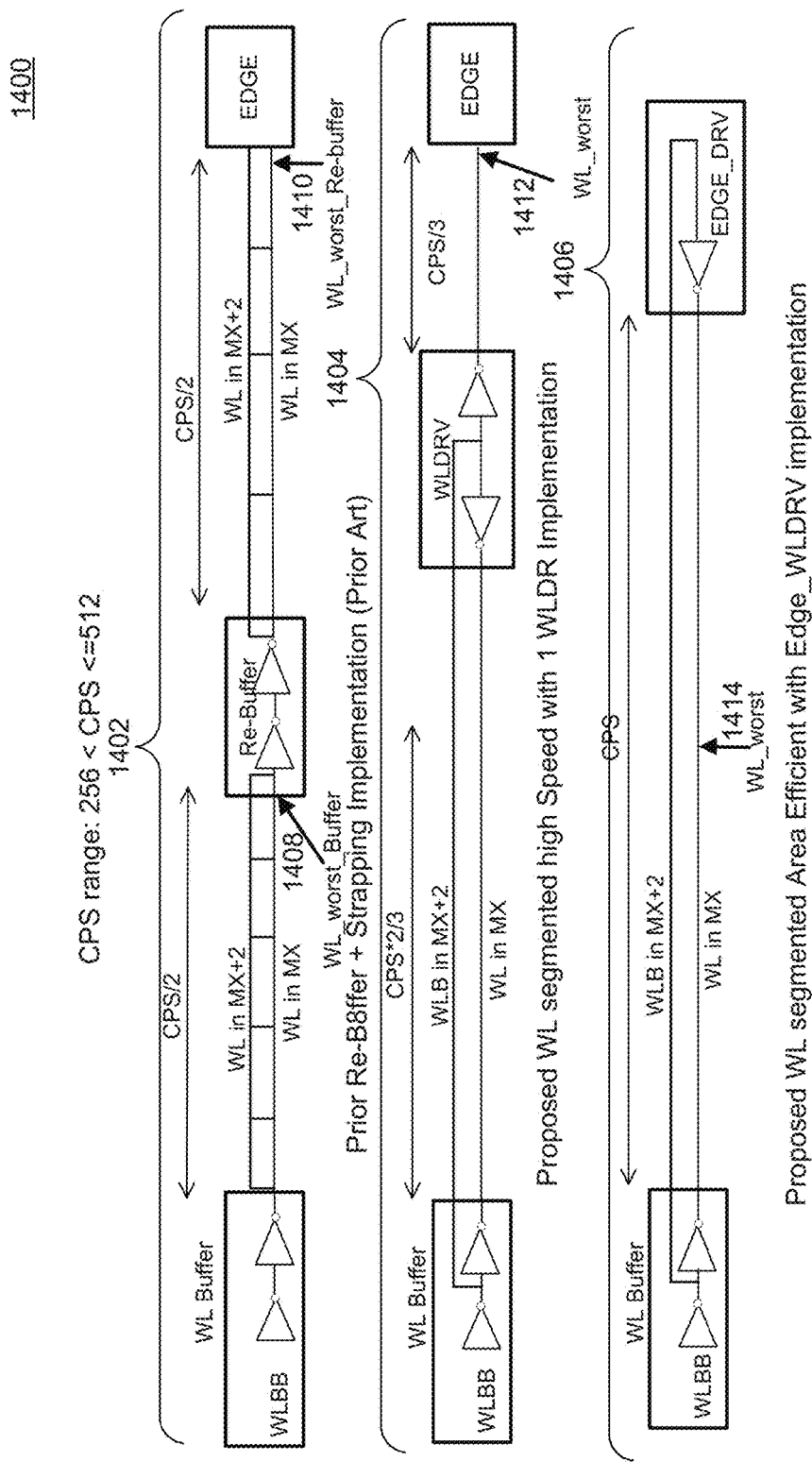
FIG. 14 illustrates a schematic representation of re-buffering scheme versus WL segmentation implementation according to an exemplary embodiment of the present disclosure.

For a WL of CPS greater than 256 but not greater than 512, as described above with reference to FIGS. 5 and 6, when the WL is segmented into three sections, a significant improvement in performance may be achieved in comparison with re-buffering and WL-strapping schemes. FIG. 13 shows performance comparison graphs for the WLs 1402, 1404, and 1406 shown in FIG. 14. As shown in FIG. 14, for a WL 1402 with re-buffering and WL-strapping implementation, the worst WL slope may be observed at a cell 1408 before re-buffering and at an Edge cell 1410. For the WL as described above with reference to FIG. 5 and similar to as shown in FIG. 14 as 1404, the worst WL slope may be observed at the Edge cell 1412. For the WL as described above with reference to FIG. 6 and similar to as shown in FIG. 14 as 1406, the worst WL slope may be observed at the center of the WL at 1414.

The WL 1404 may be high speed in comparison with the WL 1406. However, the WL 1406 may be more area efficient than the WL 1404. As described above, the segmentation may provide flexibility to choose between better performance with no address area loss or to improve SRAM area efficiency without penalizing performance. The following table summarizes performance comparison for the WLs 1402, 1404, and 1406 shown in FIG. 14.

TABLE 4

Performance and area impact comparison 256 < CPS <= 512
Performance and Area Impact Comparison (Prior vs. WL Segmented Architecture) @ 256 < CPS <= 512

| Design Implementation | WLBB to Bit-cell Flip (ps) | WL Slop (ps) | Area Impact (%) |
|---|---|---|---|
| % Re-buffer + Strapping | 464 | 217 | 4% |
| With EDGE_WLDRV (Area Efficient) | 445 | 230 | 0.5% |
| With EDGE_WLDRV (High Speed) | 297 | 132 | 4% |

For a wider WL of CPS range greater than 512 but not greater than 640, simulation shows that when WL segmented architecture as described herein is designed with single WLDRV section as discussed above with reference to FIG. 8, the performance is comparable to re-buffering and WL-strapping approach but gives advantage in area efficiency. For this range of CPS, single WLDRV section is an area efficient design implementation with better performance also. When WL is implemented with two WLDRV sections as shown and discussed above with reference to FIG. 7, then its area efficiency may be comparable to re-buffering and WL-strapping schemes, but read/write performance may be much better than the re-buffering scheme. For much wider range, also, the suggested WL segmentation provides option to choose between a more area efficient implementation or to go for ultra-high speed design approach without further impacting the area efficiency.

Figure 15:
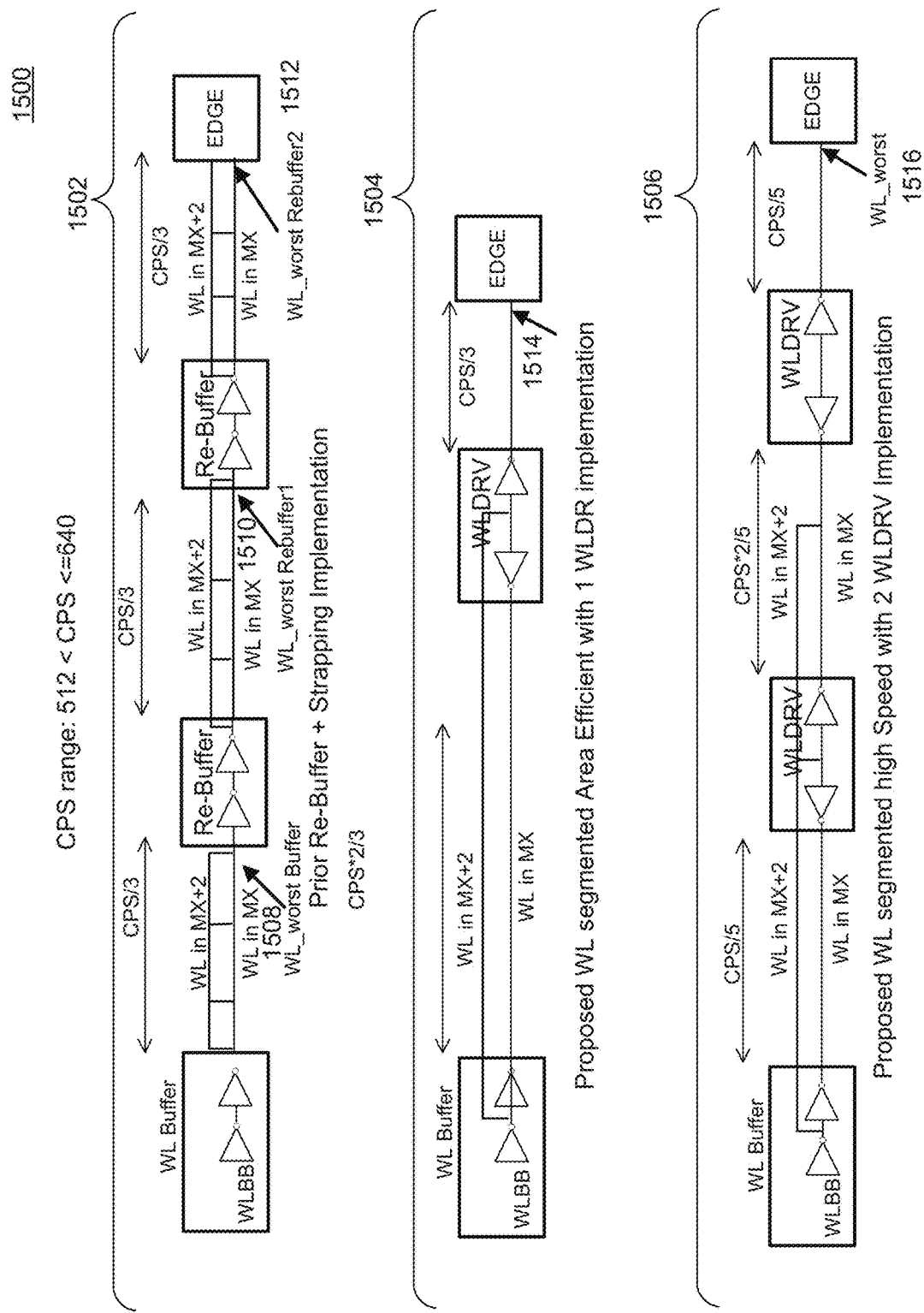
FIG. 15 illustrates a schematic representation of re-buffering scheme versus WL segmentation implementation according to an exemplary embodiment of the present disclosure.
Figure 16:
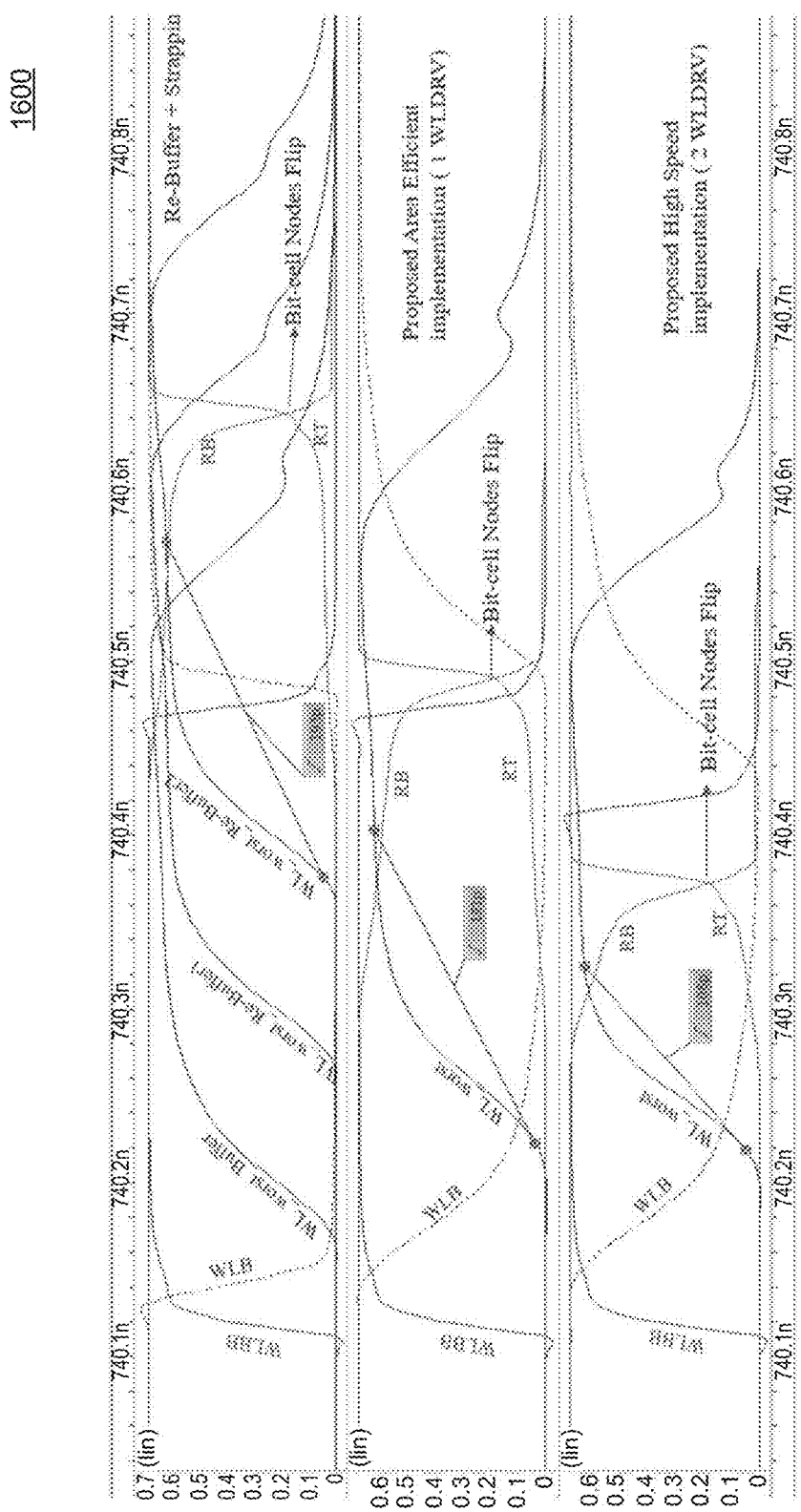
FIG. 16 illustrates a comparison analysis, according to an exemplary embodiment of the present disclosure.

As shown in FIG. 15, worst WL slope for a WL 1502 with re-buffering and WL-strapping scheme may occur at a SRAM cell before re-buffering at cells 1508, 1510, and 1512. For a WLs 1504 and 1506, worst WL slope may occur at the Edge cells 1514 and 1516 respectively. FIG. 16 is self-explanatory and the following table may summarizes performance comparison shown in FIG. 16 for the WLs 1502, 1504, and 1506 as shown in FIG. 15.

TABLE 5

Performance and area impact comparison 512 < CPS <= 640
Performance and Area Impact Comparison (Prior vs. WL Segmented Architecture) @ 512 < CPS <= 640

| Design Implementation | WLBB to Bit-cell Flip (ps) | WL Slop (ps) | Area Impact (%) |
|---|---|---|---|
| % Re-buffer + Strapping | 513 | 193 | 5% |
| With Single EDGE_WLDRV (Area Efficient + High Spped) | 372 | 181 | 3% |
| With two EDGE_WLDRV (Ultra High Speed) | 252 | 106 | 5% |

By way of non-limiting examples, WLDRV combined with WLDRV for the Edge cell may be used for improved area and speed performance.

Detailed Description—Simulation Results for Read Operation for the Exemplary Wordline Segmented Architecture The WL segmented architecture as described herein shows major gain in read operation. Metric for Read operation is normally access time of memory. Access time majorly has two components, first, generation of WL when CLK is fired, and, second, WL ON duration, which decides how much differential is generated at sense-amp input. The WL segmented architecture as described herein shows major gains in turning ON WL as fast as possible. While in case of re-buffering and WL-strapping approach, re-buffer delay may come in sequential manner. In re-buffering scheme, access time may be governed by far end WL that may have added re-buffer delays. However, the WL as described herein may escapes the far end word line from re-buffer delays, that gives direct gain to turn on WL at far location. The WL segmented architecture as described herein may virtually segment the WL into more effective segments that aid the worst read cell to generate differential signals at faster rate. By way of non-limiting example, time delay from WL ON time to sense amplifier enable time is also reduced. Waveform for differential signal generation at sense amplifier nodes is shown in FIG. 17 for CPS=512 with single WLDRV.

Figure 17:
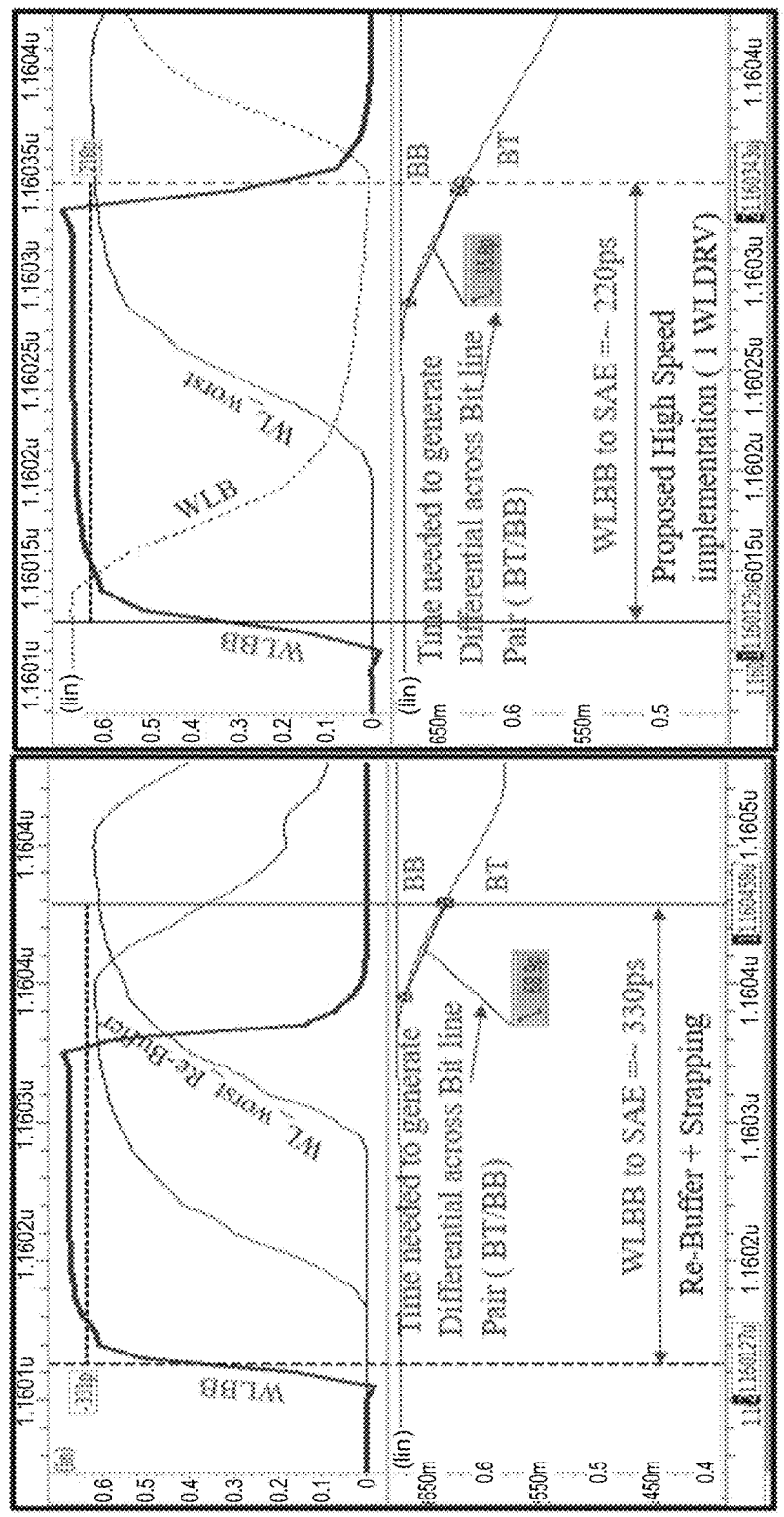
FIG. 17 illustrates a waveform comparison for read windows, according to an exemplary embodiment of the present disclosure.

FIG. 17 is self-explanatory and no discussion therefore may be required. However, the following table may summarizes performance comparison shown in FIG. 17.

TABLE 6

Read Window comparison

| Design Implementation | WLBB To Sense Enable ps | Delay for 80 mv differential signal on BT/BB (Read window) ps |
|---|---|---|
| Comparison analysis for CPS <= 256 | | |
| Strapping | 304 | 185 |
| With high speed EDGE_DRV | 261 | 132 |
| Comparison analysis for 256 < CPS <= 512 | | |
| Re-buffer + WL strapping (1 WL Re-buffer) | 425 | 170 |
| Area Efficient EDGE_WLDRV | 365 | 175 |
| High Speed 1 WLDRV | 287 | 135 |
| Comparison analysis for 512 < CPS <= 640 | | |
| Re-buffer + WL strapping (2 WL Re-buffer) | 488 | 156 |
| Area Efficient 1 WLDRV | 326 | 160 |
| High Speed 2 WLDRV | 288 | 140 |

Read performance improvement for entire CPS range has been summarized in Table 6. SOC designers may need the access time to be almost 30% less than cycle time of memory. In FinFET especially for wider memory, this constraint is very difficult to meet on SoC. However, the improvement in read performance by proposed WL segmented architecture may help to meet the constraint of access time to be within 70-75% of cycle time.

Figure 18A:
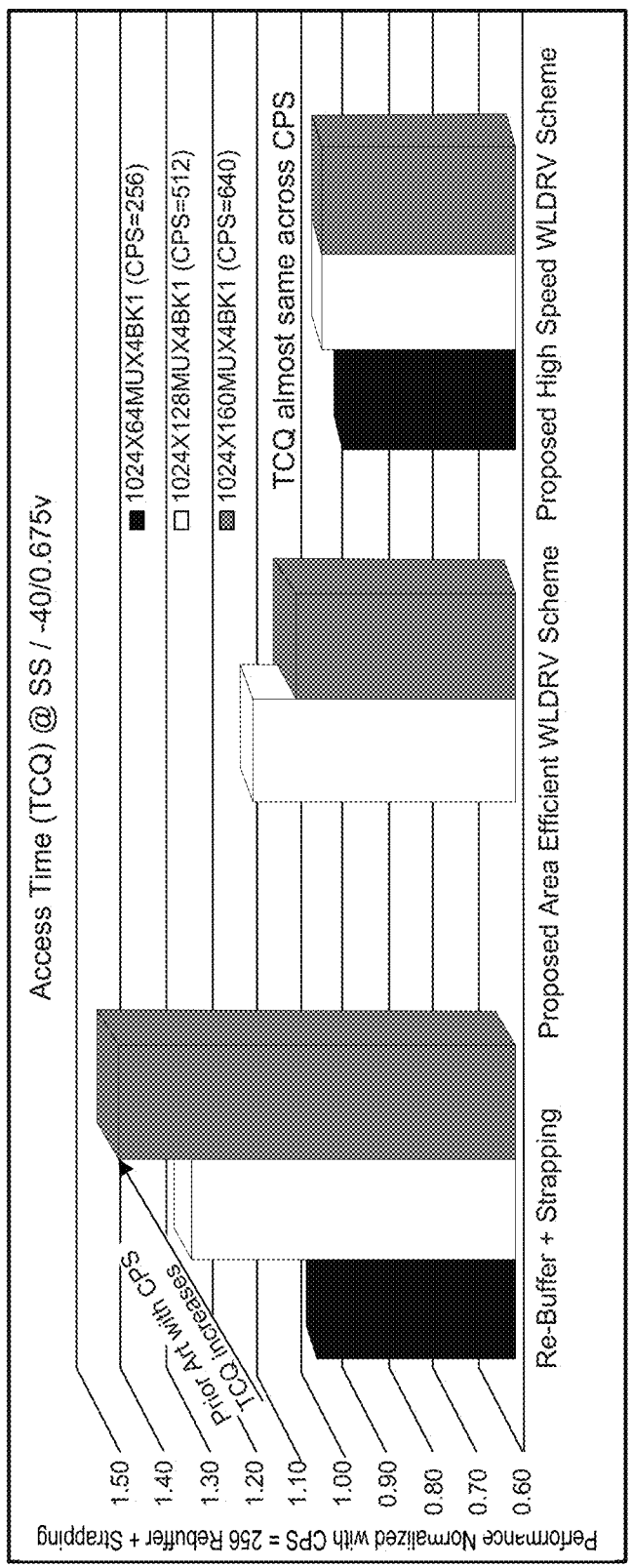
FIG. 18A illustrates access time comparison analysis at instance level, according to an exemplary embodiment of the present disclosure.
Figure 18B:
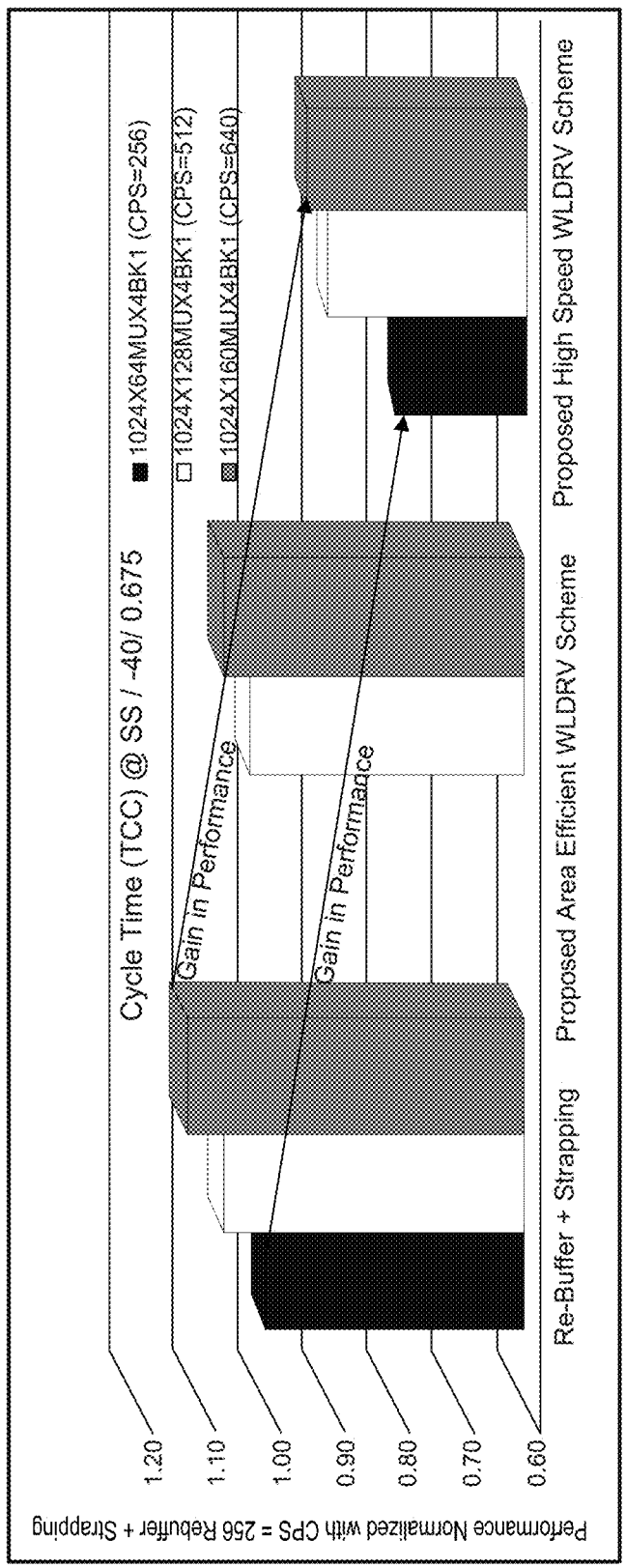
FIG. 18B illustrates cycle time comparison analysis at instance level, according to an exemplary embodiment of the present disclosure.
Figure 18C:
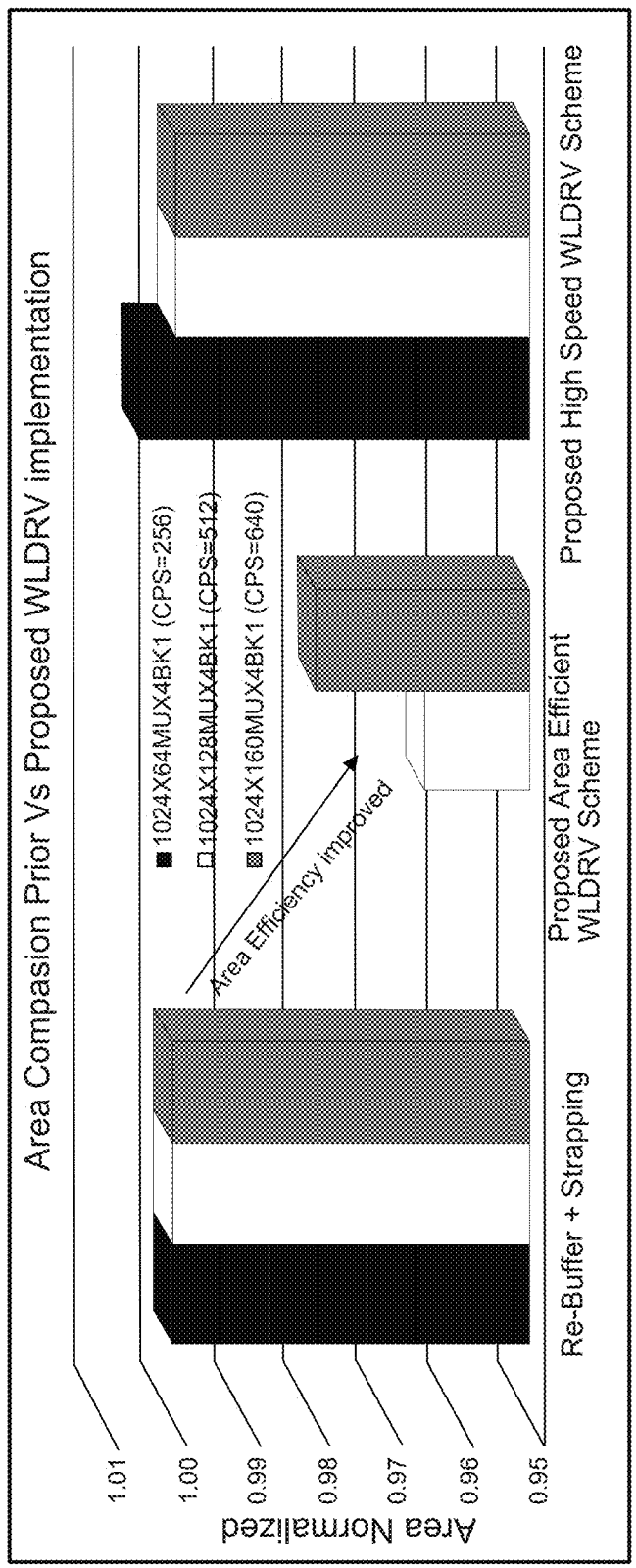
FIG. 18C illustrates area comparison analysis at instance level, according to an exemplary embodiment of the present disclosure.

The proposed WL segmentation architecture may nullify the interconnect impact to large extent. The disclosure herein may allow SRAM designers to improve area efficiency without compromising performance when compared to existing re-buffering and WL-strapping schemes. The proposed implementation has overall better PPA (power, performance & area) efficiency. It offers the designers opportunity to make performance almost CPS independent within same area as of re-buffering and WL-strapping approaches as shown in FIGS. 18A through 18C, which are self-explanatory.

Detailed Description—Technology Support from Data/Instructions to Processors/Programs Data and Information. While 'data' and 'information' often are used interchangeably (e.g., 'data processing' and 'information processing'), the term 'datum' (plural 'data') typically signifies a representation of the value of a measurement of a physical quantity (e.g., the current in a wire), or the answer to a question (e.g., "yes" or "no"), while the term 'information' typically signifies a structured set of data (often times signified by 'data structure'). A specified data structure is used to structure an electronic device to be used as a specific machine as an article of manufacture (see In re Lowry, 32 F.3d 1579 [CAFC, 1994]). Data and information are physical, for example binary data (a 'bit', usually signified with '0' and '1') enabled with two different levels of voltage in a circuit. For example, data can be enabled as an electrical, magnetic, optical or acoustical signal; a quantum state such as spin that enables a 'qubit'; or a physical state of an atom or molecule. All such data and information, when enabled, are stored, accessed, transferred, combined, compared, or otherwise acted upon, actions that require energy.

As used herein, the term 'process' signifies an unnatural sequence of physical actions and/or transformations (both also referred to as 'operations' or 'steps') to produce at least one result. The actions and transformations are technical applications of one or more natural laws of science or unnatural laws of technology. The actions and transformations often change the physical state of a machine, of structures of data and information, or of a composition of matter. Two or more actions can occur at about the same time, or one action can occur before or after another action, if they produce the same result. A description of the physical actions and/or transformations that comprise a process are often signified with a set of gerund phrases (or their semantic equivalents) that are typically preceded with the signifier 'the steps of' (e.g., "a process comprising the steps of measuring, transforming, partitioning and then distributing . . . "). The signifiers 'algorithm', 'method', 'procedure', '(sub)routine', 'protocol', 'recipe', and 'technique' often are used interchangeably with 'process', and 35 U.S.C. 100 defines a "method" as one type of process that is, by statutory law, always patentable under 35 U.S.C. 101. Many forms of knowledge, learning, skills and styles are authored, structured, and enabled—objectively—as processes—e.g., knowledge and learning as functions in knowledge programming languages. As used herein, the term 'rule' signifies a process with at least one conditional test (signified, e.g., by 'IF test THEN process'). As used herein, the term 'thread' signifies a sequence of operations or instructions that comprise a subset of an entire process. A process can be partitioned into multiple threads that can be used at or about at the same time.

As used herein, the term 'component' (also signified by 'part', and typically signified by 'element' when described in a patent text or diagram) signifies a physical object that is used to enable a process in combination with other components. For example, electronic components are used in processes that affect the physical state of one or more electromagnetic or quantum particles/waves (e.g., electrons, photons) or quasiparticles (e.g., electron holes, phonons, magnetic domains) and their associated fields or signals. Electronic components have at least two connection points to which are attached 'leads', typically a conductive wire or an optical fiber, with one end attached to the component and the other end attached to another component, typically as part of a circuit with current flows. There are at least three types of electrical components: passive, active and electromechanical. Passive electronic components typically do not introduce energy into a circuit—such components include resistors, memristors, capacitors, magnetic inductors, crystals, Josephson junctions, transducers, sensors, antennas, waveguides, etc. Active electronic components require a source of energy and can inject energy into a circuit—such components include semiconductors (e.g., diodes, transistors, optoelectronic devices), vacuum tubes, batteries, power supplies, displays (e.g., LEDs, LCDs, lamps, CRTs, plasma displays). Electromechanical components affect current flow using mechanical forces and structures—such components include switches, relays, protection devices (e.g., fuses, circuit breakers), heat sinks, fans, cables, wires, terminals, connectors and printed circuit boards. As used herein, the term 'netlist' is a specification of the components comprising an electric circuit, and electrical connections between the components. The programming language for the SPICE circuit simulation program is often used to specify a netlist. In the context of circuit design, the term 'instance' signifies each time a component is specified in a netlist.

One of the most important components as goods in commerce is the integrated circuit, and its res of abstractions. As used herein, the term 'integrated circuit' signifies a set of connected electronic components on a small substrate (thus the use of the signifier 'chip') of semiconductor material, such as silicon or gallium arsenide, with components fabricated on one or more layers. Other signifiers for 'integrated circuit' include 'monolithic integrated circuit', 'IC', 'chip', 'microchip' and 'System on Chip' ('SoC'). Examples of types of integrated circuits include gate/logic arrays, processors, memories, interface chips, power controllers, and operational amplifiers. The term 'cell' as used in electronic circuit design signifies a specification of one or more components, for example, a set of transistors that are connected to function as a logic gate. Cells are usually stored in a database, to be accessed by circuit designers and design processes.

As used herein, the term 'module' signifies a tangible structure for acting on data and information. For example, the term 'module' can signify a process that transforms data and information, for example, a process comprising a computer program. The term 'module' also can signify one or more interconnected electronic components, such as digital logic devices. A process comprising a module, if specified in a programming language, such as System C or Verilog, also can be transformed into a specification for a structure of electronic components that transform data and information that produce the same result as the process. This last sentence follows from a modified Church-Turing thesis, which is simply expressed as "Whatever can be transformed by a (patentable) process and a processor, can be transformed by a (patentable) equivalent set of modules.", as opposed to the doublethink of deleting only one of the "(patentable)".

A module is permanently structured (e.g., circuits with unalterable connections), temporarily structured (e.g., circuits or processes that are alterable with sets of data), or a combination of the two forms of structuring. Permanently structured modules can be manufactured, for example, using Application Specific Integrated Circuits ('ASICs') such as Arithmetic Logic Units ('ALUs'), Programmable Logic Arrays ('PLAs'), or Read Only Memories ('ROMs'), all of which are typically structured during manufacturing. For example, a permanently structured module can comprise an integrated circuit. Temporarily structured modules can be manufactured, for example, using Field Programmable Gate Arrays (FPGAs—for example, sold by Xilink or Intel's Altera), Random Access Memories (RAMs) or microprocessors. For example, data and information is transformed using data as an address in RAM or ROM memory that stores output data and information. One can embed temporarily structured modules in permanently structured modules (for example, a FPGA embedded into an ASIC).

Modules that are temporarily structured can be structured during multiple time periods. For example, a processor comprising one or more modules has its modules first structured by a manufacturer at a factory and then further structured by a user when used in commerce. The processor can comprise a set of one or more modules during a first time period, and then be restructured to comprise a different set of one or modules during a second time period. The decision to manufacture or implement a module in a permanently structured form, in a temporarily structured form, or in a combination of the two forms, depends on issues of commerce such as cost, time considerations, resource constraints, tariffs, maintenance needs, national intellectual property laws, and/or specific design goals. How a module is used is mostly independent of the physical form in which it is manufactured or enabled. This last sentence also follows from the modified Church-Turing thesis.

As used herein, the term 'processor' signifies a tangible data and information processing machine for use in commerce that physically transforms, transfers, and/or transmits data and information, using at least one process. A processor consists of one or more modules (e.g., a central processing unit, 'CPU', an input/output ('I/O') controller, a memory controller, a network controller, and other modules). The term 'processor' can signify one or more processors, or one or more processors with multiple computational cores/CPUs, specialized processors (for example, graphics processors or signal processors), and their combinations. Where two or more processors interact, one or more of the processors can be remotely located. Where the term 'processor' is used in another context, such as a 'chemical processor', it will be signified and defined in that context.

The processor can comprise, for example, digital logic circuitry (for example, a binary logic gate), and/or analog circuitry (for example, an operational amplifier). The processor also can use optical signal processing, DNA transformations or quantum operations, microfluidic logic processing, or a combination of technologies, such as an optoelectronic processor. For data and information structured with binary data, any processor that can transform data and information using the AND, OR and NOT logical operations (and their derivatives, such as the NAND, NOR, and XOR operations) also can transform data and information using any function of Boolean logic. A processor such as an analog processor, such as an artificial neural network, also can transform data and information. No scientific evidence exists that any of these technological processors are processing, storing and retrieving data and information, using any process or structure equivalent to the bioelectric structures and processes of the human brain.

The one or more processors also can use a process in a 'cloud computing' environment, where time and resources of multiple remote computers are shared by multiple users or processors communicating with the computers. For example, a group of processors can use at least one process available at a distributed or remote system, these processors using a communications network (e.g., the Internet, or an Ethernet) and using one or more specified interfaces (e.g., an application program interface ('API') that signifies functions and data structures to communicate with the remote process).

As used herein, the term 'computer' and 'computer system' (further defined below) includes at least one processor that, for example, performs operations on data and information such as (but not limited to) the AND, OR and NOT logical operations using electronic gates that can comprise transistors, with the addition of memory (for example, memory structured with flip-flops using the NOT-AND or NOT-OR operation). Such a processor is Turing-complete and computationally universal. A computer can comprise a simple structure, for example, comprising an I/O module, a CPU, and a memory that performs, for example, the process of inputting a signal, transforming the signal, and outputting the signal with no human intervention.

As used herein, the term 'programming language' signifies a structured grammar for specifying sets of operations and data for use by modules, processors and computers. Programming languages include assembler instructions, instruction-set-architecture instructions, machine instructions, machine dependent instructions, microcode, firmware instructions, state-setting data, or either source code or object code written in any combination of one or more higher level languages, for example, the C programming language and similar general programming languages (such as Fortran, Basic, Javascript, PHP, Python, C++), knowledge programming languages (such as Lisp, Smalltalk, Prolog, or CycL), electronic structure programming languages (such as VHDL, Verilog, SPICE or SystemC), text programming languages (such as SGML, HTML, or XML), or audiovisual programming languages (such as SVG, MathML, X3D/VRML, or MIDI), and any future equivalent programming languages. As used herein, the term 'source code' signifies a set of instructions and data specified in text form using a programming language. A large amount of source code for use in enabling any of the claimed inventions is available on the Internet, such as from a source code library such as Github.

As used herein, the term 'program' (also referred to as an 'application program') signifies one or more processes and data structures that structure a module, processor or computer to be used as a "specific machine" (see In re Alappat, 33 F3d 1526 [CAFC, 1991]). One use of a program is to structure one or more computers, for example, standalone, client or server computers, or one or more modules, or systems of one or more such computers or modules. As used herein, the term 'computer application' signifies a program that enables a specific use, for example, to enable text processing operations, or to encrypt a set of data. As used herein, the term 'firmware' signifies a type of program that typically structures a processor or a computer, where the firmware is smaller in size than a typical application program, and is typically not very accessible to or modifiable by the user of a computer. Computer programs and firmware are often specified using source code written in a programming language, such as C. Modules, circuits, processors, programs, and computers can be specified at multiple levels of abstraction, for example, using the SystemC programming language, and have value as products in commerce as taxable goods under the Uniform Commercial Code (see U.C.C. Article 2, Part 1).

A program is transferred into one or more memories of the computer or computer system from a data and information device or storage system. A computer system typically has a device for reading storage media that is used to transfer the program, and/or has an interface device that receives the program over a network. This process is discussed in the General Computer Explanation section.

Detailed Description—Technology Support General Computer Explanation

Figure 20A:
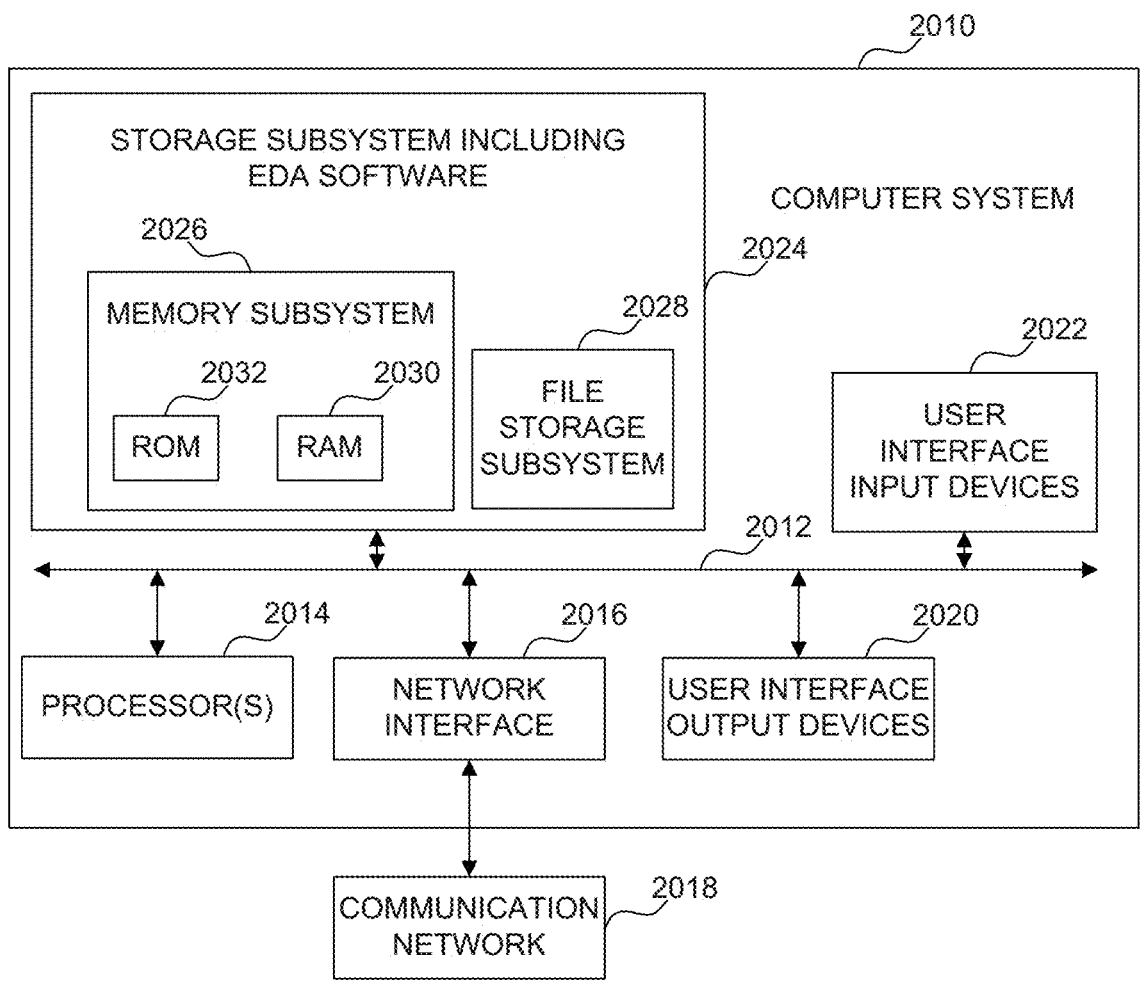
FIGS. 20A and 20B depict abstract diagrams of a computer system for use in commerce, if needed, by embodiments of the claimed inventions, as well as an embodiment of a circuit design and an embodiment of a manufactured circuit used in these claimed inventions.
Figure 20B:
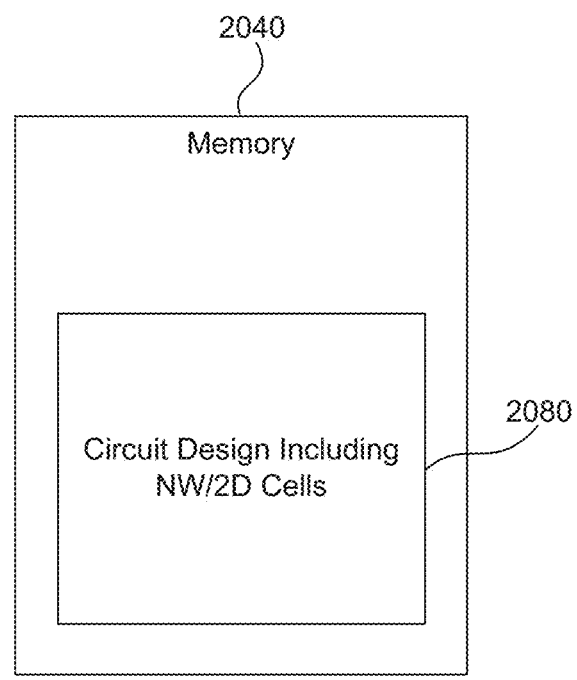

FIGS. 20A and 20B are abstract diagrams of a computer system suitable for enabling embodiments of the claimed inventions.

In FIG. 20A, the structure of computer system 2010 typically includes at least one computer 2014 which communicates with peripheral devices via bus subsystem 2012. Typically, the computer includes a processor (e.g., a microprocessor, graphics processing unit, or digital signal processor), or its electronic processing equivalents, such as an Application Specific Integrated Circuit ('ASIC') or Field Programmable Gate Array ('FPGA'). Typically, peripheral devices include a storage subsystem 2024, comprising a memory subsystem 2026 and a file storage subsystem 2028, user interface input devices 2022, user interface output devices 2020, and/or a network interface subsystem 2016. The input and output devices enable direct and remote user interaction with computer system 2010. The computer system enables significant post-process activity using at least one output device and/or the network interface subsystem.

The computer system can be structured as a server, a client, a workstation, a mainframe, a personal computer (PC), a tablet PC, a set-top box (STB), a personal digital assistant (PDA), a cellular telephone, a smartphone, a web appliance, a rack-mounted 'blade', a kiosk, a television, a game station, a network router, switch or bridge, or any data processing machine with instructions that specify actions to be taken by that machine. The term 'server', as used herein, refers to a computer or processor that typically performs processes for, and sends data and information to, another computer or processor.

A computer system typically is structured, in part, with at least one operating system program, such as Microsoft's Windows, Sun Microsystems's Solaris, Apple Computer's MacOs and iOS, Google's Android, Linux and/or Unix. The computer system typically includes a Basic Input/Output System (BIOS) and processor firmware. The operating system, BIOS and firmware are used by the processor to structure and control any subsystems and interfaces connected to the processor. Typical processors that enable these operating systems include: the Pentium, Itanium and Xeon processors from Intel; the Opteron and Athlon processors from Advanced Micro Devices; the Graviton processor from Amazon; the POWER processor from IBM; the SPARC processor from Oracle; and the ARM processor from ARM Holdings.

The claimed inventions and their embodiments are limited neither to an electronic digital logic computer structured with programs nor to an electronically programmable device. For example, the claimed inventions can use an optical computer, a quantum computer, an analog computer, or the like. Further, where only a single computer system or a single machine is signified, the use of a singular form of such terms also can signify any structure of computer systems or machines that individually or jointly use processes. Due to the ever-changing nature of computers and networks, the description of computer system 2010 depicted in FIG. 20A is intended only as an example. Many other structures of computer system 2010 have more or less components than the computer system depicted in FIG. 20A.

Network interface subsystem 2016 provides an interface to outside networks, including an interface to communication network 2018, and is coupled via communication network 2018 to corresponding interface devices in other computer systems or machines. Communication network 2018 can comprise many interconnected computer systems, machines and physical communication connections (signified by 'links'). These communication links can be wireline links, optical links, wireless links (e.g., using the WiFi or Bluetooth protocols), or any other physical devices for communication of information. Communication network 2018 can be any suitable computer network, for example a wide area network such as the Internet, and/or a local-to-wide area network such as Ethernet. The communication network is wired and/or wireless, and many communication networks use encryption and decryption processes, such as is available with a virtual private network. The communication network uses one or more communications interfaces, which receive data from, and transmit data to, other systems. Embodiments of communications interfaces typically include an Ethernet card, a modem (e.g., telephone, satellite, cable, or ISDN), (asynchronous) digital subscriber line (DSL) unit, Firewire interface, USB interface, and the like. Communication algorithms ('protocols') can be specified using one or communication languages, such as HTTP, TCP/IP, RTP/RTSP, IPX and/or UDP.

User interface input devices 2022 can include an alphanumeric keyboard, a keypad, pointing devices such as a mouse, trackball, toggle switch, touchpad, stylus, a graphics tablet, an optical scanner such as a bar code reader, touchscreen electronics for a display device, audio input devices such as voice recognition systems or microphones, eye-gaze recognition, brainwave pattern recognition, optical character recognition systems, and other types of input devices. Such devices are connected by wire or wirelessly to a computer system. Typically, the term 'input device' signifies all possible types of devices and processes to transfer data and information into computer system 2010 or onto communication network 2018. User interface input devices typically enable a user to select objects, icons, text and the like that appear on some types of user interface output devices, for example, a display subsystem.

User interface output devices 2020 can include a display subsystem, a printer, a fax machine, or a non-visual communication device such as audio and haptic devices. The display subsystem can include a cathode ray tube (CRT), a flat-panel device such as a liquid crystal display (LCD), an image projection device, or some other device for creating visible stimuli such as a virtual reality system. The display subsystem also can provide non-visual stimuli such as via audio output, aroma generation, or tactile/haptic output (e.g., vibrations and forces) devices. Typically, the term 'output device' signifies all possible types of devices and processes to transfer data and information out of computer system 2010 to the user or to another machine or computer system. Such devices are connected by wire or wirelessly to a computer system. Note: some devices transfer data and information both into and out of the computer, for example, haptic devices that generate vibrations and forces on the hand of a user while also incorporating sensors to measure the location and movement of the hand. Technical applications of the sciences of ergonomics and semiotics are used to improve the efficiency of user interactions with any processes and computers disclosed herein, such as any interactions with regards to the design and manufacture of circuits, that use any of the above input or output devices.

Memory subsystem 2026 typically includes a number of memories including a main random-access memory ('RAM') 2030 (or other volatile storage device) for storage of instructions and data during program execution and a read only memory ('ROM') 2032 in which fixed instructions are stored. File storage subsystem 2028 provides persistent storage for program and data files, and can include a hard disk drive, a floppy disk drive along with associated removable media, a CD-ROM drive, an optical drive, a flash memory such as a USB drive, or removable media cartridges. If computer system 2010 includes an input device that performs optical character recognition, then text and symbols printed on paper can be used as a device for storage of program and data files. The databases and modules used by some embodiments can be stored by file storage subsystem 2028.

Bus subsystem 2012 provides a device for transmitting data and information between the various components and subsystems of computer system 2010. Although bus subsystem 2012 is depicted as a single bus, alternative embodiments of the bus subsystem can use multiple busses. For example, a main memory using RAM can communicate directly with file storage systems using Direct Memory Access ('DMA') systems.

FIG. 20B depicts a memory 2040 such as a non-transitory, processor readable data and information storage medium associated with file storage subsystem 2028, and/or with network interface subsystem 2016, and can include a data structure specifying a circuit design. The memory 2040 can be a hard disk, a floppy disk, a CD-ROM, an optical medium, removable media cartridge, or any other medium that stores computer readable data in a volatile or non-volatile form, such as text and symbols on paper that can be processed by an optical character recognition system. A program transferred in to and out of a processor from such a memory can be transformed into a physical signal that is propagated through a medium (such as a network, connector, wire, or circuit trace as an electrical pulse); or through a medium such as space or an atmosphere as an acoustic signal, or as electromagnetic radiation with wavelengths in the electromagnetic spectrum longer than infrared light).

Detailed Description—Technology Support EDA System/Workflow Explanation

Figure 19:
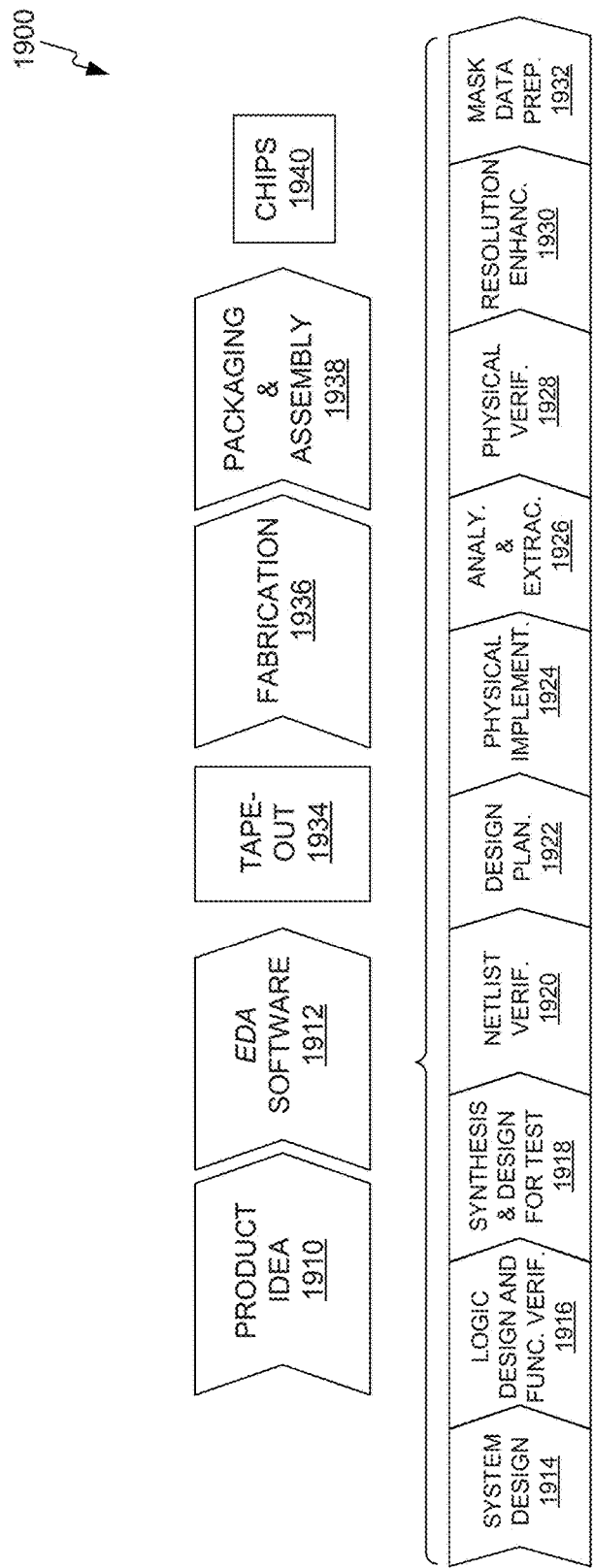
FIG. 19 depicts a flowchart of various processes used during the design and manufacture of an integrated circuit.

FIG. 19 depicts a set of processes 19-100 used during the design, verification and fabrication of an article of manufacture such as an integrated circuit to transform and verify design data and instructions that represent the integrated circuit. Each of these processes can be structured and enabled as multiple modules. The term 'EDA' signifies the term 'Electronic Design Automation'. These processes start with the creation of a product idea 19-110 with information supplied by a designer, information which is transformed to create an article of manufacture that uses a set of EDA processes 19-112. When the design is finalized, it is taped-out 19-134, which typically is when artwork (e.g., geometric patterns) for the integrated circuit is sent to a fabrication facility to manufacture the mask set, which is then used to manufacture the integrated circuit. After tape-out, a semiconductor die is manufactured 19-136 and packaging and assembly processes 19-138 are performed to produce the finished integrated circuit 19-140.

Specifications for a circuit or electronic structure are as used in commerce at multiple levels of useful abstraction ranging from low-level transistor material layouts to high-level description languages. Most designers start with a description using one or more modules with less detail at a high-level of abstraction to design their circuits and systems, using a hardware description language ('HDL') such as VHDL, Verilog, SystemVerilog, SystemC, MyHDL or OpenVera. The high-level description is easier for designers to understand, especially for a vast system, and can describe very complex systems that are difficult to understand using a lower level of abstraction that is a more detailed description. The HDL description can be transformed into other levels of abstraction that are used by the developers. For example, a high-level description can be transformed to a logic-level register transfer level ('RTL') description, a gate-level description, a layout-level description, or a mask-level description. Each lower abstraction level that is a less abstract description adds more useful detail into the design description, for example, more details for the modules that comprise the description. The lower-levels of abstraction that are less abstract descriptions can be generated by a computer, derived from a design library, or created by another design automation process. An example of a specification language at a lower level of abstraction language for specifying more detailed descriptions is SPICE, which is much used for detailed descriptions of circuits with many analog components. A circuit specification for a circuit also has value as an article of manufacture in commerce as a good under the Uniform Commercial Code (see U.C.C. Article 2, Part 1). Descriptions at each level of abstraction are enabled for use by the corresponding tools of that layer (for example, a formal verification tool), and some of the modules of the abstractions need not be novel or unobvious.

A design process that uses EDA processes 19-112 includes processes 19-114 to 19-132, which are described below. This design flow description is used only to illustrate, not to limit. For example, a designer of an integrated circuit design can use the design processes in a different sequence than the sequence depicted in FIG. 19. For the embodiments disclosed herein, products from Synopsys, Inc. of Mountain View, Calif. (hereinafter signified by Synopsys), are used to enable these processes, and/or similar products from other companies.

During system design 19-114, a designer specifies the functionality to be manufactured. The designer also can optimize the power, performance and area (physical and/or lines of code) and minimize costs, etc. Partitioning of the design into different types of modules can occur at this stage. Exemplary EDA products from Synopsys that enable system design 19-114 include: the Model Architect, Saber, System Studio, and Designware products.

During logic design and functional verification 19-116, modules in the circuit are specified in one or more description languages, and the specification is checked for functional accuracy, that is, that the modules produce outputs that match the requirements of the specification of the circuit or system being designed. Exemplary HDL languages are Verilog, VHDL and SystemC. Functional verification typically uses simulators and other programs such as testbench generators, static HDL checkers and formal verifiers. In some situations, special systems of modules referred to as 'emulators' or 'prototyping systems' are used to speed up the functional verification. Exemplary EDA products from Synopsys that can be used at this stage include: VCS, Vera, Designware, Magellan, Formality, ESP and Leda products. Exemplary emulator and prototyping products available from Synopsys that enable logic design and functional verification 19-116 include: Zebu® and Protolink® (® signifies 'Registered Trademark').

During synthesis and design for test 19-118, HDL code is transformed to a netlist (which typically is a graph structure where the edges represent components of a circuit and where the nodes represent how the components are interconnected). Both the HDL code and the netlist are hierarchical articles of manufacture that can be used by an EDA product to verify that the integrated circuit, when manufactured, performs according to its design. This netlist can be optimized for a target semiconductor manufacturing technology. Additionally, the finished integrated circuit is tested to verify that it satisfies the requirements of the specification. Exemplary EDA products from Synopsys that enable synthesis and design for test 19-118 include: the Design Compiler, Physical Compiler, Test Compiler, Power Compiler, FPGA Compiler, Tetramax, and Designware products.

During netlist verification 19-120, the netlist is checked for compliance with timing constraints and for correspondence with the HDL code. Exemplary EDA products from Synopsys that enable netlist verification 19-120 include: the Formality, Primetime, and VCS products.

During design planning 19-122, an overall floor plan for the integrated circuit is constructed and analyzed for timing and top-level routing. Exemplary EDA products from Synopsys that enable design planning 19-122 include: the Astro and IC Compiler products.

During layout implementation 19-124, physical placement (positioning of circuit components such as transistors or capacitors) and routing (connection of the components by multiple conductors) occurs, and the selection of cells from a library to enable specific logic functions. As used herein, the term 'cell' signifies a set of transistors, other components, and interconnections that provides a Boolean logic function (e.g., AND, OR, NOT, XOR) or a storage function (such as a flipflop or latch). As used herein, a circuit 'block' comprises two or more cells. Both a cell and a circuit block can be referred to as a module, and are enabled as both physical structures and in simulations. Parameters are specified for selected cells (based on 'standard cells') such as size, and made accessible in a database for use by EDA products. Examples of databases that can be used for accessing cells include MySQL and PostgreSQL. Exemplary EDA products from Synopsys that enable layout implementation 19-124 include: the Astro and IC Compiler products.

During analysis and extraction 19-126, the circuit function is verified at the layout level, which permits refinement of the layout design. Exemplary EDA products from Synopsys that enable analysis and extraction 19-126 include: the Astrorail, Primerail, Primetime, and Star RC/XT products.

During physical verification 19-128, the layout design is checked to ensure that manufacturing constraints are correct, such as DRC constraints, electrical constraints, lithographic constraints, and that circuitry function matches the HDL design specification. Exemplary EDA products from Synopsys that enable physical verification 19-128 include: the Hercules product.

During resolution enhancement 19-130, the geometry of the layout is transformed to improve how the design is manufactured. Exemplary EDA products from Synopsys that enable resolution enhancement 19-130 include: the *Proteus* product.

During tape-out, data is created to be used (after lithographic enhancements are applied if appropriate) for production of lithography masks. Example EDA products from Synopsys that enable tape-out include: the IC Compiler and Custom Designer products.

During mask-data preparation 19-132, the 'tape-out' data is used to produce lithography masks that are used to produce finished integrated circuits. Exemplary EDA products from Synopsys that enable mask-data preparation 19-132 include: the CATS family of products.

For all of the abovementioned EDA products, similar products from other EDA vendors, such as Cadence, Siemens, other corporate entities or various non-commercial products from universities, or open source repositories, can be used as an alternative.

A storage subsystem of a computer system (such as computer system 610 of FIG. 6A) is preferably used to store the programs and data structures that are used by some or all of the EDA products described herein, and products used for development of cells for the library and for physical and logical design that use the library.

Detailed Description—Semantic Support

The signifier 'commercial solution' signifies, solely for the following paragraph, an engineering domain-specific (and thus non-preemptive—see Bilski): electronic structure, a process for a specified machine, a manufacturable circuit (and their Church-Turing equivalents) or a composition of matter that applies science and/or technology for use in commerce to solve a technical problem.

The signifier 'abstract' (when used in a patent claim for any enabled embodiments disclosed herein for a new commercial solution that is a scientific use of one or more laws of nature {see Benson}, and that solves a problem of technology {see Diehr} for use in commerce—or improves upon an existing solution used in commerce {see Diehr})—is precisely defined by the inventor(s) {see MPEP 2111.01 ($9^{th}$ edition, Rev. 08.2017)} as follows:

a) a new commercial solution is 'abstract' if it is not novel (e.g., it is so well known in equal prior art {see Alice} and/or the use of equivalent prior art solutions is long prevalent {see Bilski} in science, engineering or commerce), and thus unpatentable under 35 U.S.C. 102, for example, because it is 'difficult to understand' {see Merriam-Webster definition for 'abstract' 1 how the commercial solution differs from equivalent prior art solutions; or b) a new commercial solution is 'abstract' if the existing prior art includes at least one analogous prior art solution {see KSR}, or the existing prior art includes at least two prior art publications that can be combined {see Alice} by a skilled person {often referred to as a 'PHOSITA', see MPEP 2141-2144 ($9^{th}$ edition, Rev. 08.2017)} to be equivalent to the new commercial solution, and is thus unpatentable under 35 U.S.C. 103, for example, because it is 'difficult to understand' how the new commercial solution differs from a PHOSITA-combination/-application of the existing prior art; or c) a new commercial solution is 'abstract' if it is not disclosed with a description that enables its praxis, either because insufficient guidance exists in the description, or because only a generic implementation is described {see Mayo} with unspecified components, parameters or functionality, so that a PHOSITA is unable to instantiate an embodiment of the new solution for use in commerce, without, for example, requiring special programming {see Katz} (or, e.g., circuit design) to be performed by the PHOSITA, and is thus unpatentable under 35 U.S.C. 112, for example, because it is 'difficult to understand' how to use in commerce any embodiment of the new commercial solution.

Detailed Description—Definitions

As used herein, the semiotic function RUD(t,p1,p2, . . . ) signifies that a skilled person can obtain, if needed for progressing the useful arts, a reasonably useful definition of the signifier 't' that comprises the union of definitions of T in one or more U.S. Patents and U.S. Patent Applications 'p1', 'p2', etc. For example, 'RUD(substantially, 9532624)' signifies that a skilled person can obtain a reasonably useful definition of 'substantially' as it is defined in U.S. Pat. No. 9,532,624.

DEFINITIONS: RUD(substantially, 9532624).

Detailed Description—Conclusion

The Detailed Description signifies in isolation the individual features, structures, functions, or characteristics described herein and any combination of two or more such features, structures, functions or characteristics, to the extent that such features, structures, functions or characteristics or combinations thereof are enabled by the Detailed Description as a whole in light of the knowledge and understanding of a skilled person, irrespective of whether such features, structures, functions or characteristics, or combinations thereof, solve any problems disclosed herein, and without limitation to the scope of the Claims of the patent. When an embodiment of a claimed invention comprises a particular feature, structure, function or characteristic, it is within the knowledge and understanding of a skilled person to use such feature, structure, function, or characteristic in connection with other embodiments whether or not explicitly described, for example, as a substitute for another feature, structure, function or characteristic.

In view of the Detailed Description, a skilled person will understand that many variations of the claimed inventions can be enabled, such as function and structure of elements, described herein while remaining in the domain of the claimed inventions. One or more elements of an embodiment can be substituted for one or more elements in another embodiment, as will be understood by a skilled person. Writings about embodiments signify their uses in commerce, thereby enabling other skilled people to similarly use in commerce.

This Detailed Description is fitly written to provide knowledge and understanding. It is neither exhaustive nor limiting of the precise structures described, but is to be accorded the widest scope consistent with the disclosed principles and features. A skilled person can enable many equivalent variations. Without limitation, any and all equivalents described, signified or Incorporated By Reference in this patent application are specifically Incorporated By Reference into the Detailed Description. In addition, any and all variations described, signified or Incorporated By Reference with respect to any one claimed invention and its embodiment also are included with all other claimed inventions and their embodiments. Any such variations include both currently known variations as well as future variations, for example any element used for enablement includes a future equivalent element that provides the same function, regardless of the structure of the future equivalent element.

It is intended that the domain of the set of claimed inventions and their embodiments be defined and judged by the following Claims and their equivalents. The Detailed Description includes the following Claims, with each Claim standing on its own as a separate claimed invention. The embodiments of the claimed inventions can have more structure and features than are explicitly specified in the Claims.

Detailed Description—Reference Documents

[1] V. Kumar, N. Puri, S. Kumar, and S. Srivastav, "A sub-0.5 v reliability aware-negative bitline write-assisted 8t dp-sram and w1 strapping novel architecture to counter dual patterning issues in 10 nm FinFET," in VLSI Design and 2017 16th International Conference on Embedded Systems (VLSID), 2017 30th International Conference on. IEEE, 2017, pp. 269-274.

[2] Vivek Nautiyal; Gaurav Singla; Sagar Dwivedi; Satinderjit Singh; Ingming Chang; Jitendra Dasani; Fakhruddin Ali Bohra "Self-Timed Shaper Circuit for Wide Memories in Advanced CMOS Technologies, 2018 IEEE International Symposium on Circuits and Systems (ISCAS) 2018.

[3] M. T. Bohr, "Interconnect scaling-the real limiter to high performance ulsi," in Electron Devices Meeting, 1995. IEDM '95., International. IEEE, 1995, pp. 241-244.

[4] D. Shah, K. Siva, G. Girishankar, and N. Nagaraj, "Optimizing interconnect for performance in standard cell library," in Circuits and Systems, 2006. APCCAS 2006. IEEE Asia Pacific Conference on. IEEE, 2006, pp. 1280-1284.

[5] A. Ceyhan, M. Jung, S. Panth, S. K. Lim, and A. Naeemi, "Evaluating chip-level impact of cu/low-kappa performance degradation on circuit performance at future technology nodes," IEEE Transactions on Electron Devices, vol. 62, no. 3, pp. 940-946, 2015.

What is claimed:

1. A memory array, comprising:
a plurality of memory cells arranged in a plurality of rows and a plurality of columns, wherein memory cells of a row of the plurality of rows are logically grouped into a plurality of memory array segments in accordance with a total count of the memory cells of the row and an area efficiency; and
a plurality of drivers, wherein a first driver of the plurality of drivers is combined with a first end of a first memory array segment of the plurality of memory array segments,
a second driver of the plurality of drivers is combined with a first end of a second memory array segment of the plurality of memo array segments,
wherein a second end of the first memory array segment is adjacent to a second end of the second memory array segment, and
wherein the second end of the first memory array segment and the second end of the second memory array segment are coupled to a wordline of a plurality of wordlines.

2. The memory array of claim 1, wherein the memory cells of the row of the plurality of rows are logically grouped into the plurality of memory array segments further in accordance with performance requirement of an application.

3. The memory array of claim 1, wherein input signals corresponding to the plurality of drivers are routed in a higher metal track and/or in a lower metal track.

4. The memory array of claim 3, wherein the input signals routed in the higher metal track are inverted signals of the corresponding input signals in the lower metal track.

5. The memory array of claim 1, wherein the plurality of memory array segments have a same number of columns of memory cells.

6. The memory array of claim 1, wherein a number of columns of memory cells in the memory array segment is different from the adjacent memory array segment.

7. The memory array of claim 1, further comprising a driver section, the driver section comprising the second driver and a third driver, wherein a first end of the second driver is combined with the first end of the second memory array segment, a first end of the third driver is combined with a first end of a third memory array segment of the plurality of memory segments, and a second end of the second driver is combined with a second end of the third driver.

8. A method for a memory array production, the method comprising:
determining a count of memory array segments of a row of a plurality of rows, the row of the plurality of rows comprising a plurality of memory cells arranged in a plurality of columns;
grouping the plurality of memory cells of the row of the plurality of rows into a plurality of memory array segments according to a total count of memory cells of the row and an area efficiency;
combining a first driver with a first end of a first memory array segment of the plurality of memory array segments;
combining a second driver with a first end of a second memory array segment of the plurality of memory array segments;

placing a second end of the first memory array segment adjacent to a second end of the second memory array segment; and coupling the second end of the first memory array segment and the second end of the second memory array segment to a wordline of a plurality of wordlines.

9. The method of claim 8, wherein the grouping the plurality of memory cells further comprises grouping the plurality of memory cells in accordance with performance requirement of an application.

10. The method of claim 8, further comprising routing an input signal of the driver in a higher metal track and/or a lower metal track.

11. The method of claim 10, wherein the input signal routed in the higher metal track is an inverted signal of the corresponding input signal in the lower metal track.

12. The method of claim 8, wherein the plurality of memory array segments have a same number of columns of memory cells.

13. The method of claim 8, wherein a number of columns of memory cells in the memory array segment is different from the adjacent memory array segment.

14. The method of claim 8, wherein at least one wordline of the plurality of wordlines is a reference wordline, and the method further comprises:

generating a clock to operate the reference wordline and the plurality of wordlines simultaneously.

15. A non-transitory, tangible computer-readable device having instructions stored thereon that, when executed by at least one computing device, causes the at least one computing device to perform operations comprising:

determining a count of memory array segments of a row of a plurality of rows, the row of the plurality of rows comprising a plurality of memory cells arranged in a plurality of columns;

grouping the plurality of memory cells of the row of the plurality of rows into a plurality of memory array segments according to a total count of memory cells of the row and an area efficiency;

combining a first driver with a first end of a first memory array segment of the plurality of memory array segments;

combining a second driver with a first end of a second memory array segment of the plurality of memory array segments;

placing a second end of the first memory array segment adjacent to a second end of the second memory array segment; and coupling the second end of the first memory array segment and the second end of the second memory array segment to a wordline of a plurality of wordlines.

16. The non-transitory, tangible computer-readable device of claim 15, wherein the operations further comprise grouping the plurality of memory cells in accordance with a performance requirement of an application.

17. The non-transitory, tangible computer-readable device of claim 15, wherein the operations further comprise routing an input signal of the driver in a higher metal track and/or a lower metal track, and wherein the input signal routed in the higher metal track is an inverted signal of the corresponding input signal in the lower metal track.

18. The non-transitory, tangible computer-readable device of claim 15, wherein the plurality of memory array segments have a same number of columns of memory cells.

19. The non-transitory, tangible computer-readable device of claim 15, wherein the number of columns of memory cells in the memory array segment is different from the adjacent memory array segment.

20. The non-transitory, tangible computer-readable device of claim 15, wherein at least one wordline of the plurality of wordlines is a reference wordline, and the operations further comprise:

generating a clock to operate the reference wordline and the plurality of wordlines simultaneously.

* * * * *